(12) United States Patent
Betsui et al.

(10) Patent No.: US 10,103,100 B2
(45) Date of Patent: Oct. 16, 2018

(54) SEMICONDUCTOR DEVICE

(71) Applicant: Renesas Electronics Corporation, Koutou-ku, Tokyo (JP)

(72) Inventors: Takafumi Betsui, Tokyo (JP); Nobuyuki Morikoshi, Tokyo (JP); Tetsushi Hada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 133 days.

(21) Appl. No.: 15/163,647

(22) Filed: May 24, 2016

(65) Prior Publication Data

US 2017/0033045 A1    Feb. 2, 2017

(30) Foreign Application Priority Data

Jul. 31, 2015    (JP) .................................. 2015-151553

(51) Int. Cl.
    *G06F 13/42*    (2006.01)
    *H01L 23/522*   (2006.01)
    (Continued)

(52) U.S. Cl.
    CPC ........ *H01L 23/5227* (2013.01); *G06F 1/3243* (2013.01); *G06F 1/3296* (2013.01); *G06F 13/4282* (2013.01); *H01L 23/49838* (2013.01); *H01L 24/16* (2013.01); *G06F 13/385* (2013.01); *H01L 2224/1623* (2013.01); *H01L 2224/16227* (2013.01); *H01L 2924/15311* (2013.01); *H01L 2924/19041* (2013.01);
    (Continued)

(58) Field of Classification Search
    None
    See application file for complete search history.

(56) References Cited

U.S. PATENT DOCUMENTS

| 7,277,298 B2 | 10/2007 | Ohsaka |
| 2005/0218489 A1* | 10/2005 | Satou ................ H01L 23/49575 257/678 |

(Continued)

FOREIGN PATENT DOCUMENTS

| JP | 2006-128633 A | 5/2006 |
| JP | 2009-004628 A | 1/2009 |

*Primary Examiner* — Henry Tsai
*Assistant Examiner* — Aurangzeb Hassan
(74) *Attorney, Agent, or Firm* — Shapiro, Gabor and Rosenberger, PLLC

(57) ABSTRACT

The semiconductor device has a semiconductor chip having a first-signal-output circuit operating at a first-power-supply voltage, a second-signal-output circuit operating at a second power supply voltage, and a plurality of bump electrodes; and a wiring board including a first main surface facing the main surface of the semiconductor chip, a second main surface opposite to the first main surface with a wiring layer therebetween, first external terminals on the first main surface, and second ones on the second main surface; the former being mounted on the latter to couple the bump electrodes to the first external terminals. When viewed from the second main surface, second external terminals to be supplied with the first signal and the second signal are arranged closer to the semiconductor chip than second external terminals to be supplied with the first power supply voltage and the second power supply voltage.

16 Claims, 14 Drawing Sheets

(51) Int. Cl.
  *H01L 23/00*   (2006.01)
  *H01L 23/498*   (2006.01)
  *G06F 1/32*   (2006.01)
  *H01R 13/645*   (2006.01)
  *G06F 13/38*   (2006.01)
  *H01R 24/58*   (2011.01)

(52) U.S. Cl.
  CPC ............... *H01L 2924/19105* (2013.01);
    *H01R 13/6456* (2013.01); *H01R 24/58* (2013.01)

(56) References Cited

U.S. PATENT DOCUMENTS

| | | | |
|---|---|---|---|
| 2005/0231990 A1* | 10/2005 | Uno ................ | H01L 24/49 363/147 |
| 2014/0217582 A1* | 8/2014 | Baba ............... | H01L 23/49822 257/737 |

\* cited by examiner

SEMICONDUCTOR DEVICE

CROSS-REFERENCE TO RELATED APPLICATIONS

The disclosure of Japanese Patent Application No. 2015-151553 filed on Jul. 31, 2015 including the specification, drawings and abstract is incorporated herein by reference in its entirety.

BACKGROUND

The present invention relates to a semiconductor device, in particular, a semiconductor device having a plurality of semiconductor chips and a wiring board having thereon the semiconductor chips.

One of the technologies for sealing a plurality of semiconductor chips or semiconductor packages in one package is SiP (silicon in package). For example, in SiP, a wiring board having thereon a plurality of semiconductor chips is provided as a semiconductor device. In this case, the wiring board is equipped with a main surface (first main surface) facing the semiconductor chip to be mounted thereon and a main surface (second main surface) facing a user's (customer's) board on which the semiconductor device is mounted. The first main surface is provided with a plurality of external terminals (first external terminals) to be coupled to the semiconductor chip and the second surface is provided with a plurality of external terminals (second external terminals) to be coupled to the user's board. The wiring board has a wiring layer sandwiched between the first main surface and the second main surface and a metal wiring in the wiring layer electrically couples between the first external terminals and/or between the first external terminals and the second external terminals.

For example, coupling between the first external terminals via the metal wiring enables omission of a wiring that couples between the semiconductor chips in the user's board and thereby reduction in the user's burden. In addition, it enables speed-up.

Speaking about a technology of mounting a semiconductor device on a user's board, Japanese Unexamined Patent Application Publication No. 2006-128633 and Japanese Unexamined Patent Application Publication No. 2009-4628 describe a technology of mounting a semiconductor device having a ball grid array (BGA) package structure on a printed board which is a user's board.

SUMMARY

For example, semiconductor devices for control which are mounted in automobiles are required to have many high-speed interface circuits in order to meet the trend toward electronic automobiles. In this case, when different kinds of interface circuits are used, they respectively operate at different voltages as a power supply voltage.

In a semiconductor chip having therein a number of interface circuits, these interface circuits are arranged, for example, along one side of the semiconductor chip. The power supply voltages and interface signal of many interface circuits arranged along one side are, as a set, coupled to first external terminals of a wiring board and they are coupled to second external terminals arranged close to each other via a metal wiring in a wiring layer. By such a constitution, the interface signal and the power supply voltage corresponding thereto are, as a set, coupled to second external terminals arranged close to each other and coupled to a user's board.

The number of interface circuits is large and an interface signal and a power supply voltage corresponding thereto are used as a set so that in the wiring board, some interface circuits inevitably have, for example, a long power supply wiring for supplying a power supply voltage. In other words, there occurs an increase in the length of a power supply wiring between a first external terminal coupled to a power supply voltage of the interface circuits and a second external terminal to be coupled to this first external terminal.

Increase in the length of a power supply wiring leads to an increase in inductance. In interface circuits, an operating current flowing through a power supply wiring changes, for example, according to an interface signal to be output or input from the circuit. Particularly in a high-speed interface circuit, a longer power supply wiring and a larger inductance promotes noise generation and/or reduction in power supply voltage, which may presumably cause malfunctions.

Another problem and novel features will be apparent from the description herein and accompanying drawings.

Japanese Unexamined Patent Application Publication No. 2006-128633 and Japanese Unexamined Patent Application Publication No. 2009-4628 describe a differential circuit, which is a high-speed interface circuit, but they include neither description nor suggestion on a problem that occurs when an interface signal and a power supply voltage are arranged as a set.

A semiconductor device according to one embodiment is equipped with a semiconductor chip including a main surface and a wiring board including a first main surface facing the main surface of the semiconductor chip and having an area larger than an area of the main surface of the semiconductor chip.

The above-described semiconductor chip is equipped with a first circuit that operates at a first power supply voltage and outputs a first signal and a second circuit that operates at a second power supply voltage different from the first power supply voltage and outputs a second signal. It has, on the main surface thereof, a plurality of bump electrodes including bump electrodes to be supplied with the first power supply voltage, the second power supply voltage, the first signal, and the second signal, respectively. The wiring board is equipped with a wiring layer, a second main surface opposed to the first main surface while sandwiching a wiring layer therebetween and having an area greater than an area of the main surface of the semiconductor chip, a plurality of first external terminals formed on the first main surface, and a plurality of second external terminals coupled to the first external terminals via a wiring in the wiring layer and formed on the second main surface. The semiconductor chip is mounted so that the main surface thereof faces the first main surface in such a manner that the bump electrodes are coupled to the first external terminals, respectively.

Viewed from the second main surface, the second external terminals to be supplied with the first power supply voltage and the second power supply voltage are second external terminals arranged closer to the semiconductor chip than the second external terminals to be supplied with the first signal and the second signal.

The second external terminals to be supplied with the first power supply voltage and the second power supply voltage are positionally separated from the second external terminals to be supplied with the first signal and the second signal and are arranged at a position closer to the semiconductor chip. This makes it possible to shorten a wiring that supplies the first power supply voltage and the second supply voltage and thereby preventing an increase in inductance. As a result, occurrence of malfunctions can be reduced.

According to the one embodiment, a semiconductor device causing fewer malfunctions can be provided.

DETAILED DESCRIPTION

Figure 1:
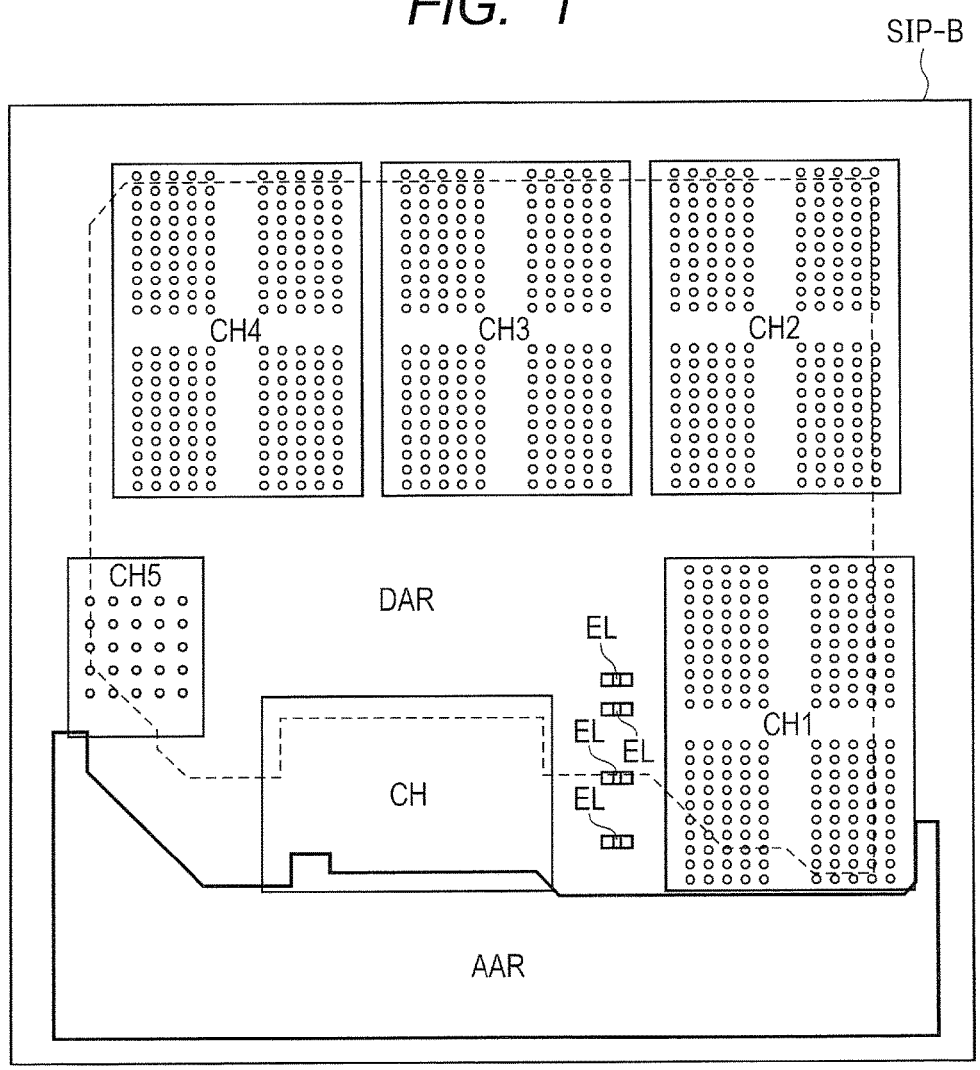
FIG. 1 is a schematic plan view showing the constitution of a semiconductor device of First Embodiment.

The embodiments of the present invention will be described specifically based on some drawings. In all the drawings for describing the embodiments, like members will be identified by like reference numerals in principle and an overlapping description will be omitted in principle.

Figure 2:
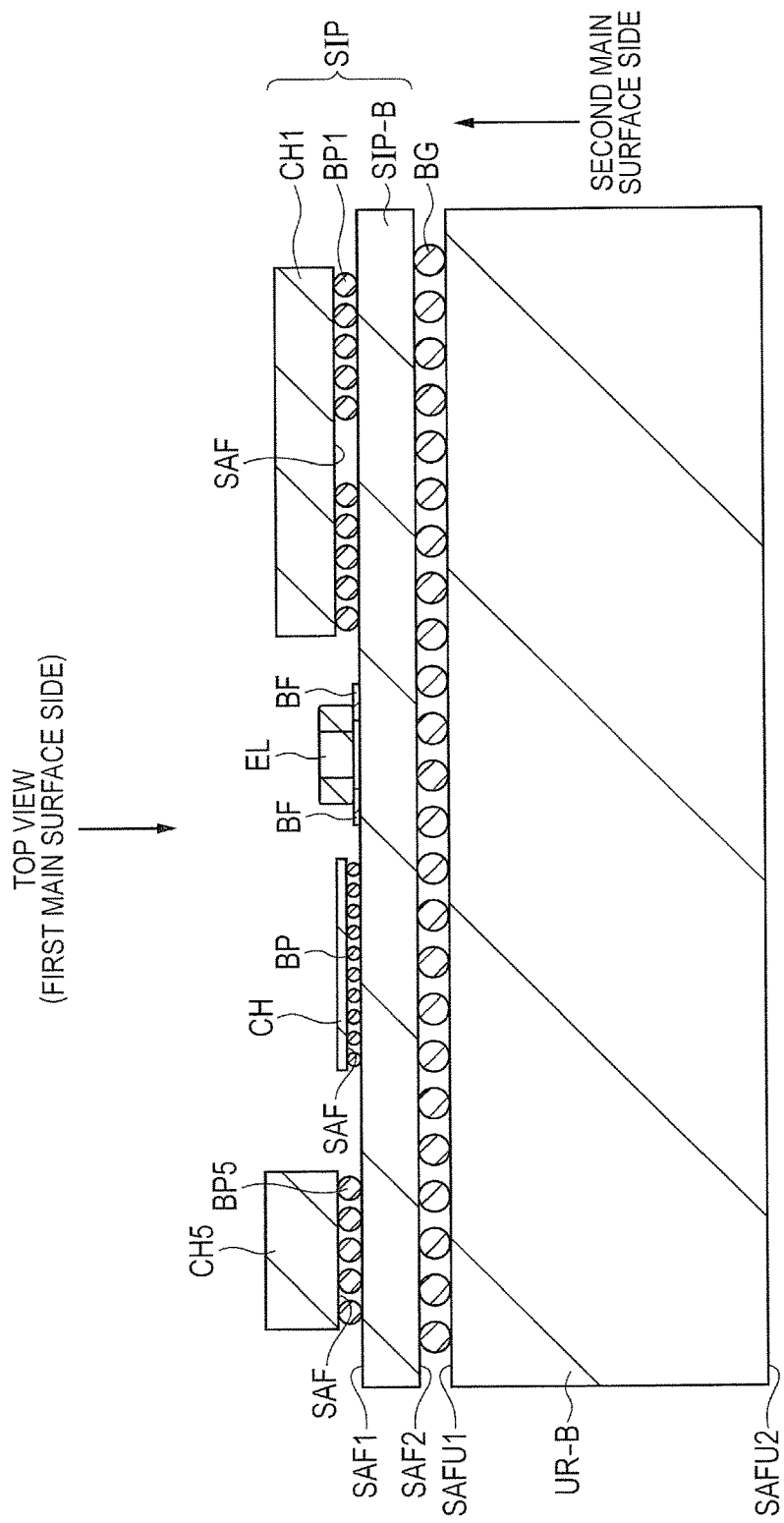
FIG. 2 is a schematic cross-sectional view showing the constitution of the semiconductor device of First Embodiment.

(First Embodiment)
<Outline of the Constitution of Semiconductor Device>
FIG. 1 is a schematic plan view showing the constitution of a semiconductor device SIP of First Embodiment. FIG. 2 is a schematic cross-sectional view showing the constitution of the semiconductor device SIP of First Embodiment. First, the constitution of the semiconductor device SIP of First Embodiment will be described referring to FIGS. 1 and 2.

In FIG. 1, CH and CH1 to CH5 represent a semiconductor chip, EL represents an electronic part such as capacitor, and SIP-B represents a wiring board. FIG. 2 shows, as an example, the cross-section of the semiconductor chips CH, CH1, and CH5 and one of the electronic parts EL, each shown in FIG. 1.

The semiconductor chips CH and CH1 to CH5 each have, on a semiconductor substrate (chip) thereof, various circuit blocks formed using known manufacturing technologies. The semiconductor chip has, on the main surface SAF (FIG. 2) thereof, a plurality of bump electrodes (not shown) and the various circuit blocks have electrical coupling to bump electrodes corresponding thereto.

The wiring board SIP-B is equipped with a first main surface SAF1, a second main surface SAF2, and wiring layers. FIG. 2 shows the first main surface SAF1 and the second main surface SAF2 of the wiring board SIP-B. The semiconductor chips CH and CH1 to CH5 are on the wiring board SIP-B in such a manner that the respective main surfaces SAF of the semiconductor chips CH and CH1 to CH5 face the first main surface SAF1 of the wiring board SIP-B. FIG. 2 shows only the semiconductor chips CH, CH1, and CH5 mounted on the wiring board SIP-B but also other semiconductor chips CH2 to CH4 are similarly on the wiring board SIP-B.

The wiring board SIP-B has, on the first main surface SAF1 thereof, a plurality of first external terminals (not shown). These first external terminals and bump electrodes formed on the main surface of the semiconductor chips CH and CH1 to CH5 have therebetween bumps BP and BP1 to BP5 indicated by a circle and via these bumps BP and BP1 to BP5, the bump electrodes of the semiconductor chips CH and CH1 to CH5 have electrical coupling to the first external terminals on the first main surface SAF1 of the wiring board SIP-B. In FIG. 2, the bump BP is different from the bumps BP1 to BP5 in size, but it is needless to say that they have the same size.

Although not shown, the wiring board SIP-B has, on the second main surface SAF2 thereof, a plurality of second external terminals. The first main surface SAF1 and the second main surface SAF2 of the wiring board SIP-B have therebetween wiring layers. Although described later referring to FIG. 3, the wiring layers include a plurality of metal wiring layers and insulation wiring layers. By a wire (metal wire) formed by the metal wiring layer in the wiring layer, the first external terminals formed on the first main surface SAF1 are coupled to each other or the first external terminals formed on the first main surface SAF1 are coupled to the second external terminals formed on the second main surface SAF2. This means that the metal wiring in the wiring layer electrically couples between desired first external terminals or between a desired first external terminal and a desired second external terminal.

In FIG. 2, UR-B represents a user's board (which may hereinafter be called "user board"). The user board UR-B is equipped with a first main surface SAFU1, a second main surface SAFU2, and a wiring layer sandwiched between the first main surface SAFU1 and the second main surface SAFU2. The wiring board SIP-B is on the user board UR-B so that the second main surface SAF2 faces the first main surface SAFU-1 of the user board UR-B. The user board UR-B also has, on the first main surface SAFU1 thereof, a plurality of user first external terminals and has, on the second surface SAFU2, a plurality of user second external terminals, though these external terminals are now shown in the drawing. A metal wiring layer in a wiring layer sandwiched between the first main surface SAFU1 and the second main surface SAFU2 electrically couples between desired user first external terminals or between a desired user first external terminal and a desired user second external terminal.

The user first external terminals formed on the first main surface SAFU1 of the user board UR-B and the second external terminals formed on the second main surface SAF2 on the wiring board SIP-B have electrical coupling therebetween via a plurality of bumps BG indicated by a circle in FIG. 2, respectively. For example, the bump electrodes of the semiconductor chip CH are therefore electrically coupled to the user second external terminals on the second main surface SAFU2 of the user board UR-B.

In FIGS. 1 and 2, the electronic part EL means a capacitor. Terminals BF of this capacitor have electrical coupling to the first external terminals formed on the first main surface SAF1 of the wiring board SIP-B. Although no particular limitation is imposed, the capacitor (electronic part EL)

shown in FIGS. 1 and 2 means a bypass capacitor for stabilizing a power supply voltage.

In FIG. 1, bumps provided between the main surface SAF of each of the semiconductor chips CH1 to CH5 and the first external terminals formed on the first main surface of the wiring board SIP-B are indicated as an example by circles, respectively. Although not shown in FIG. 1, there is also a plurality of bumps between the bump electrodes formed on the main surface FAS of the semiconductor chip CH and the first external terminals formed on the first main surface of the wiring board SIP-B.

FIGS. 1 and 2 show an example of electrically coupling, via the bumps, between the bump electrodes formed on the main surface SAF of the semiconductor chip and the first external terminals formed on the first main surface SAF1 of the wiring board SIP-B, but not only the bumps but any member capable of electrically coupling them may be used. Similarly, for between the second external terminals on the second main surface SAF2 of the wiring board SIP-B and the user first external terminals on the first main surface SAFU1 of the user board URB, not only bumps but any member capable of electrically coupling them may be used.

In First Embodiment, although no particular limitation is imposed, the semiconductor chip CH has therein a microprocessor and a plurality of high-speed interface circuits as a circuit block. The semiconductor chips CH1 to CH4 have therein a dynamic memory as a circuit block, while the semiconductor chip CH5 has therein an electrically reprogrammable nonvolatile memory (flash memory) as a circuit block. Since the wiring board SIP-B has, on the first main surface SAF1 thereof, a plurality of semiconductor chips CH and CH1 to CH5 arranged in parallel to each other, the area of the first main surface SAF1 of the wiring board SIP-B is greater than the area of the main surface of each of the semiconductor chips CH and CH1 to CH5. The second main surface SFA2 and the first main surface SAF1 of the wiring board SIP-B extend parallel to each other so that the area of the second main surface SAF2 of the wiring board SIP-B is also greater than the area of the main surface of each of the semiconductor chips CH and CH1 to CH5.

In FIG. 1, a region DAR surrounded by a broken line and an area AAR surrounded by a solid line schematically show the kind of wirings in the wiring board SIP-B. Wirings in the wiring layer of the wiring board SIP-B indicated by the region DAR are used mainly for supply of a digital power supply voltage for operating the semiconductor chips CH and CH1 to CH5 and transmission of digital signals. Wirings in the wiring layer of the wiring board SIP-B indicated by the region AAR are, on the other hand, used mainly for supply of an analog power supply voltage for operating a high-speed interface circuit in the semiconductor chip CH and transmission of analog signals.

In the present specification, a downward view from the upper side will be described as an upper view in FIG. 2. When a description is made based on the wiring board SIP-B, a view of the first main surface SAF1 of the wiring board SIP-B from the upper side in FIG. 2 will be described as a view from the first main surface side (first main surface). Similarly, a view of the second main surface SAF2 of the wiring board SIP-B from the downside in FIG. 2 will be described as a view from the second main surface side (second main surface).

Figure 3:
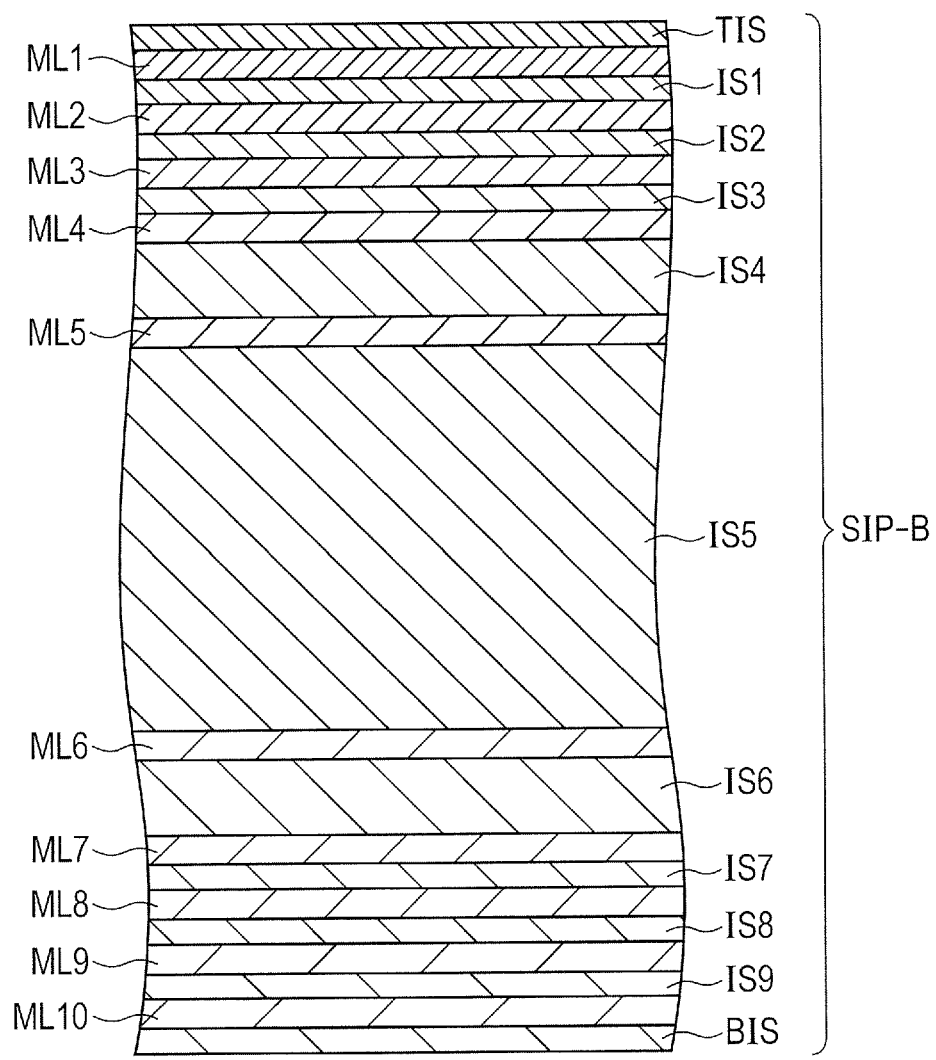
FIG. 3 is a cross-sectional view showing the cross-section of a wiring board of First Embodiment.

FIG. 3 is a cross-sectional view showing the cross-section of the wiring board SIP-B of First Embodiment. In FIG. 3, TIS represents a top insulating film, BIS represents a bottom insulating film, and IS1 to IS9 each represents an insulation layer. In addition, ML1 to ML10 each represents a metal wiring layer. This means that the wiring board SIP-B is equipped with a top insulating film TIS, a bottom insulating film BIS, metal wiring layers ML1 to ML10, and insulation layers IS1 to IS9. The metal wiring layers ML1 to ML10 and the insulation layers IS1 to IS9 are sandwiched between the top insulating film TIS and the bottom insulating film BIS and the metal wiring layers ML1 to ML10 and the insulation layers IS1 to IS9 are arranged alternately. In other words, the metal wiring layers ML1 and ML10 and the insulation layers IS1 to IS9 are stacked over one after another. The metal wiring layers ML1 to ML10 are therefore electrically isolated from each other. The first main surface SAF1 of the wiring board SIP-B is on the side of the top insulating film TIS and the second main surface SAF2 of the wiring board SIP-B is on the side of the bottom insulating film BIS.

Although not shown in FIG. 3, when first external terminals formed on the first main surface SAF1 are coupled to each other, opening portions are made at desired positions of the top insulating film TIS and electrodes which will be the first external terminals are formed. In addition, opening portions are provided at a desired position of a desired layer (single or plural layers) of the insulation layers IS1 to IS9, followed by filling the resulting opening portion(s) with a metal to electrically couple desired metal wiring layers. A metal wiring for electrically coupling between the first external terminals is thus formed. Similarly, when the first external terminal formed on the first main surface SAF1 and the second external terminal formed on the second main surface SAF2 are coupled to each other, an opening portion is provided at a desired position of the top insulating film TIS and the bottom insulating film BIS and electrodes which will be the first external terminal and the second external terminal are formed. In addition, an opening portion is provided at a desired position of a desired layer (single or plural layers) of the insulation layers IS1 to IS9 and then, the resulting opening portion is filled with a metal to form a desired metal wiring. This leads to electrical coupling between the first external terminal and the second external terminal.

In the region DAR shown in FIG. 1, for example, the second metal wiring layer ML2 and the fourth metal wiring layer ML4 are used mainly as a wiring for transmitting digital signals, while the remaining metal wiring layers ML1, ML3 and ML5 to ML10 are used mainly as a wiring for supplying a digital power supply voltage and a ground voltage. In the region AAR shown in FIG. 1, on the other hand, the second metal wiring layer ML2 is used mainly as a wiring for transmitting high-speed interface signals and the remaining metal wiring layers ML1 and ML3 to ML10 are used mainly as a wiring for supplying an analog power supply voltage and a ground voltage.

In First Embodiment, the wiring board SIP-B is formed by stacking three buildup layers over both surfaces of a four-layer core board. Referring to FIG. 3, the four-layer core board is included of four metal wiring layers ML4 to ML7. The metal wiring layer ML4 is a core layer top and serves as a first main surface of the core board, while a metal wiring layer ML7 opposite to the metal wiring layer ML4 serving as the first main surface is a core layer bottom and serves as a second main surface of the core board. The core board is a four-layer core board having two metal wiring layers ML5 and ML6 sandwiched between the metal wiring layer ML4 serving as the first main surface (core layer top) and the metal wiring layer ML7 serving as the second main surface (core layer bottom).

Three buildup layers are stacked over the metal wiring layer ML4 serving as the first main surface of the four-layer core board and three buildup layers are stacked over the metal wiring layer ML7 serving as the second main surface. FIG. 3 shows the three buildup layers stacked over the first main surface of the core board as the metal wiring layers ML3 to ML1 and the three buildup layers stacked over the second main surface of the core board as the metal wiring layers ML8 to ML10.

The processing accuracy of the core layers and buildup layers depends on their manufacturing steps, but in general, the buildup layers are manufactured with higher processing accuracy than the core layers. In addition, the buildup layers do not need a thick and long through-hole. It is therefore desired to use buildup layers for the formation of a high-speed signal wiring for transmitting high-speed signals. Although not limited, this embodiment has a signal wiring formed for transmitting digital signals and high-speed interface signals using the second metal wiring layer ML2 which is a buildup layer.

<Constitution of Semiconductor Chip>

Figure 4:
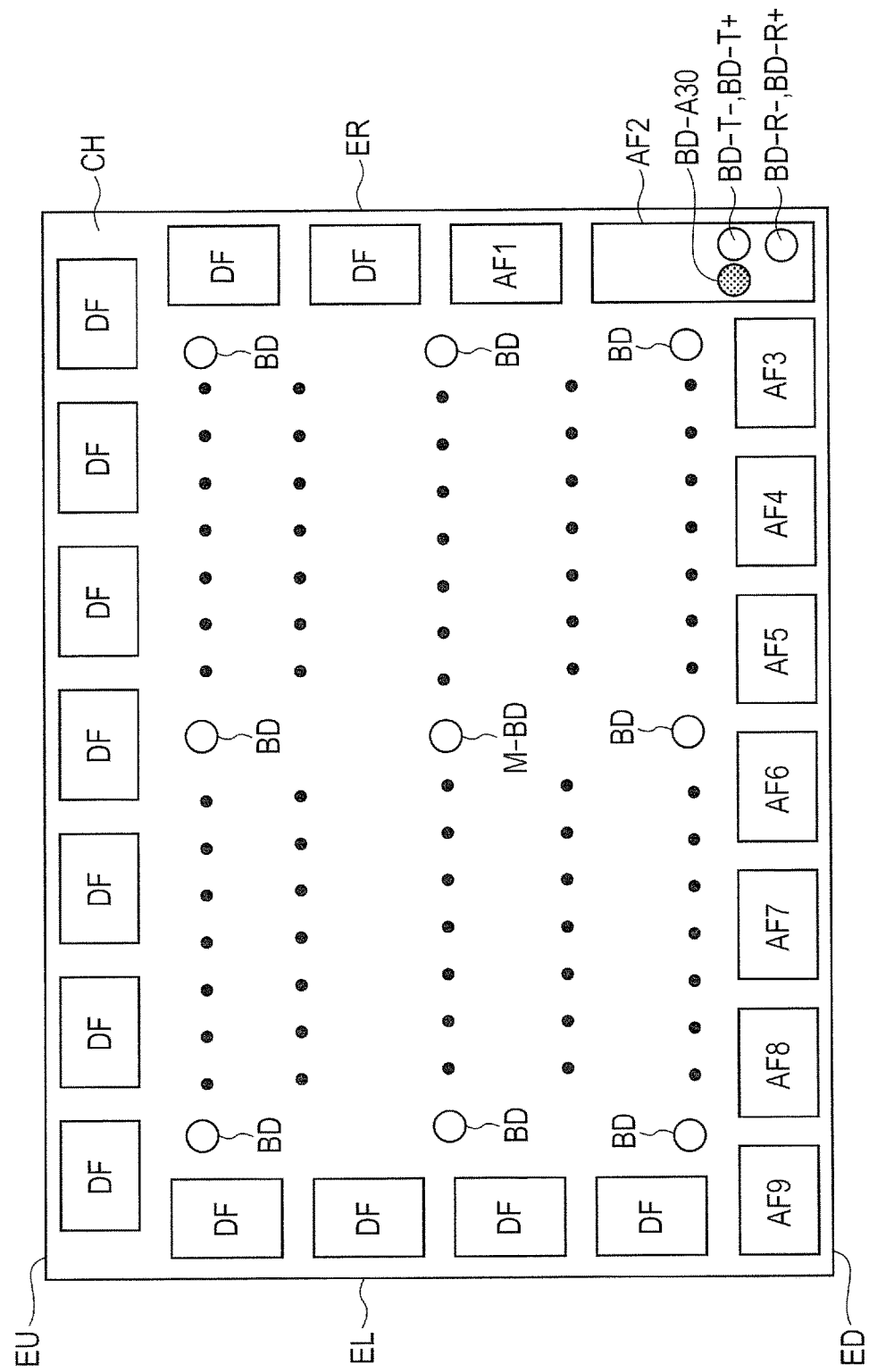
FIG. 4 is a plan view showing the constitution of a semiconductor chip of First Embodiment.

FIG. 4 is a plan view showing the constitution of the semiconductor chip of First Embodiment. Here, a plan view of the semiconductor chip CH equipped with a microprocessor and an interface circuit is shown in FIG. 4. FIG. 4 shows the plane of the semiconductor chip CH when viewed from the second main surface SAF2. In other words, arrangement of pad electrodes on the main surface SAF of the semiconductor chip CH is shown.

The main surface SAF of the semiconductor chip CH has four sides EU, ED, ER, and EL. This means that the main surface SAF is surrounded by four sides. The sides EU and ED extend in parallel to each other and the sides ER and EL extend in parallel to each other. The sides EU and ED are orthogonal to the sides ER and EL.

The semiconductor chip CH has, on the main surface SAF thereof, a plurality of pad electrodes and they are arranged two-dimensionally and regularly. Among the pad electrodes arranged on the main surface SAF, pad electrodes BD arranged two-dimensionally and regularly at the center of the main surface SAF are used as a pad electrode to be supplied with a digital power supply voltage and a digital ground voltage (GND). In this case, although no particular limitation is imposed, the digital power supply voltage and the digital ground voltage are supplied in zigzag manner. Pad electrodes arranged along each of the sides EU, ED, ER, and EL are, on the other hand, used as a pad electrode for sending or receiving interface signals and a pad electrode to be supplied with an interface-circuit power supply voltage. In other words, these sides and the pad electrodes BD to be supplied with a digital power supply voltage have therebetween the interface-circuit pad electrodes. To prevent the drawing from becoming complicated, nine pad electrodes BD are shown as a typical one to be supplied with a digital power supply voltage. FIG. 4 shows an arrangement example of pad electrodes at the center of the main surface SAF of the semiconductor chip CH. Among the pad electrodes BD, the pad electrode arranged at the center is indicated particularly as M-BD.

The semiconductor chip CH is equipped with a plurality of interface circuits different in kind from each other. For example, it is equipped with a digital-signal interface circuit that outputs, inputs, or inputs/outputs control signals from the microprocessor; a digital-signal interface circuit to be used for sending or receiving data between the microprocessor and other semiconductor chips CH1 to CH5; a high-speed interface circuit, and the like.

Although an example of the constitution of the high-speed interface circuit will be described later, this interface circuit is equipped with a differential circuit. The differential circuit operates by an analog power supply voltage.

In the semiconductor chip CH of First Embodiment, bump electrodes of the digital-signal interface circuit exist along each of the sides EU, EL, and a portion of the side ER. In addition, bump electrodes of the high-speed interface circuit exist along the side ED and a portion of the side ER. In FIG. 4, in order to prevent the drawing from becoming complicated, the bump electrodes of the digital-signal interface circuit are not shown respectively but shown as an interface bump electrode region DF. Also, bump electrodes of the high-speed interface circuit are shown as an interface bump electrode regions AF1 to AF9. The interface bump electrode regions DF and AF1 to AF9 each have therein a plurality of bump electrodes corresponding interface bump electrode region AF2 as an example.

In First Embodiment, the semiconductor chip CH has, as the high-speed interface circuit, the following six interface circuits, though the high-speed interface circuit is not particularly limited to them. Described specifically, it has, as the interface circuit, an interface circuit of universal serial bus (which may hereinafter be called "USB") standard and an interface circuit of HDMI (high-definition multimedia interface) standard. In addition, it has, as the interface circuit, an interface circuit of LVDS (low voltage differential signaling) technology, an interface circuit of eSATA (external Serial ATA) technology, an interface circuit of PCIe (PCI express) standard, and an interface circuit of MIPI-CSI standard. The number of some of these interface circuits is not limited to one but two or more. Bump electrodes corresponding to these high-speed interface circuits exists along the side ED and a portion of the side ER.

FIG. 4 shows an arrangement example of bump electrodes corresponding to the interface circuits of USB standard in the interface bump electrode region AF2. FIG. 4 shows, among the bump electrodes arranged in the interface bump electrode region AF2, bump electrodes BD-A30, BD-T−, BD-T+, and BD-R−, BD-R+. The bump electrode BD-30 is an analog-power-supply pad electrode to be supplied with an analog power supply voltage; the bump electrode BD-T−, BD-T+ is a signal bump electrode that sends high-speed interface signals; and the bump electrode BD-R−, BD-R+ is a signal bump electrode that receives high-speed interface signals.

The remaining interface-circuit bump electrodes (regions AF1 and AF3 to AF9) include, similar to the interface-circuit bump electrodes (region AF2) of USB standard, analog-power-supply bump electrodes to be supplied with an analog power supply voltage and signal bump electrodes that send and/or receive high-speed interface signals.

The following description will be made with an interface circuit of USB standard as an example so that the interface circuit of USB standard will next be described in advance.

The USB standard has a plurality of kinds (generations). In First Embodiment, interface circuits of three USB standards are provided and the number of the interface circuits is two or more for each kind. Described specifically, they are an interface circuit (third circuit) of USB 1.1 standard having a maximum data transfer rate (third data transfer rate) of 1.5 Mbps/s and 12 Mbps/s, an interface circuit (first circuit) of USB 2.0 standard having a maximum data transfer rate (first data transfer rate) of 480 Mbps/s, and an interface circuit (second circuit) of USB 3.0 standard having a maximum data transfer rate second data transfer rate) of 5 Gbps/s and a plurality of each of these circuits is provided. The USB standard with the maximum data transfer rate of 1.5 Mbps/s is also called "low speed mode" (which may hereinafter be called "LS mode"); that with the maximum data transfer rate of 12 Mbps/s is also called "full speed mode" (which may hereinafter be called "FS mode"); that with the maximum data transfer rate of 480 Mbps/s is also called "high speed mode" (which may hereinafter be called "HS mode"); and that with the maximum data transfer rate of 5 Gbps/s is also called "super speed mode" (which may hereinafter be called "SS mode").

USB standards are compatible among the above-described kinds. Described specifically, an interface circuit of USB 3.0 standard can transfer data at the maximum data transfer rate in any of LS mode, FS mode, and HS mode, while an interface circuit of USB 2.0 standard can transfer data at the maximum data transfer rate in either of LS mode or FS mode.

An interface circuit of USB standard outputs or inputs differential signals as high-speed interface signals. A potential difference between differential signals which are interface signals output or input from or to the interface circuit differs depending on the kind of the USB standard. A potential difference between differential signals differ among USB 1.1 standard, USB 2.0 standard, and USB 3.0 standard and a potential difference becomes smaller in the order of USB 1.1 standard, USB 2.0 standard, and USB 3.0 standard. An analog power supply voltage to be supplied to the interface circuit that processes differential signals, which are interface signals, is different accordingly.

In First Embodiment, the interface circuit of USB 1.1 standard is supplied with an analog power supply voltage (third power supply voltage) of, for example, 3.3V; the interface circuit of USB 2.0 standard is supplied with an analog power supply voltage (first power supply voltage) of, for example, 1.8V; and the interface circuit of USB 3.0 standard is supplied with an analog power supply voltage (second power supply voltage) of, for example, 0.8V.

Although no particular limitation is imposed, the interface bump electrode region AF2 shown in FIG. 4 has therein bump electrodes corresponding to the interface circuits of USB 3.0 standard. The analog-power-supply bump electrode BD-A30 is therefore supplied with an analog voltage (0.8V) corresponding to USB 3.0 standard. In addition, signal bump electrodes BD-T−, BD-T+, BD-T+(R+), and BD-R−, BD-R+ output or input differential signals of the maximum data transfer rate in SS mode according to USB 3.0 standard.

Although no particular limitation is imposed, the interface bump electrode region AF2 has also therein a bump electrode corresponding to the interface circuit of USB 1.1 standard and a bump electrode corresponding to the interface circuit of USB 2.0 standard. In this embodiment, the bump electrode corresponding to the interface circuit of USB 2.0 standard and the bump electrode corresponding to the interface circuit of USB 1.1 standard are partially used in common. This means that a bump electrode is shared by the interface circuit for USB 1.1 and the interface circuit for USB 2.0, while the analog-power-supply bump electrodes for USB 1.1 and USB 2.0 are arranged separately in the interface bump electrode region AF2.

Figure 5:
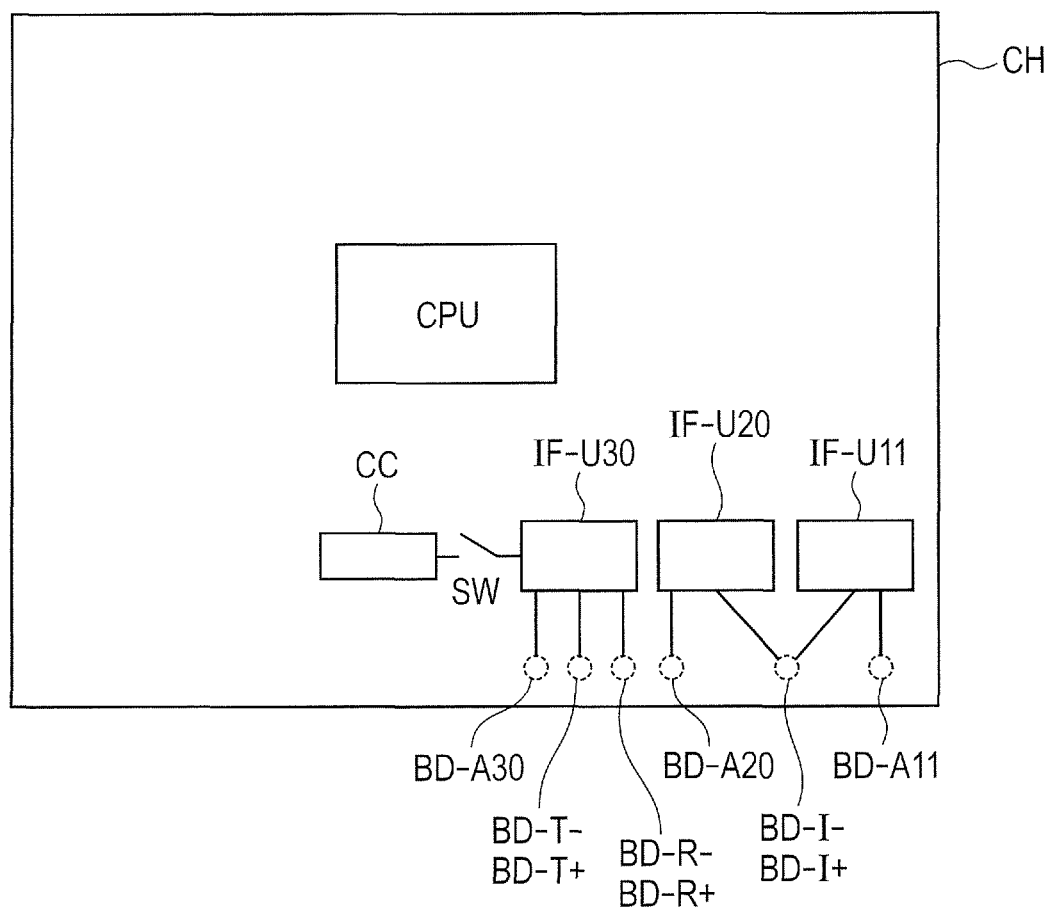
FIG. 5 is a block diagram showing the constitution of the semiconductor chip of First Embodiment.

Next, the constitution in the semiconductor chip CH will be described. FIG. 5 is a block diagram showing the constitution of the semiconductor chip CH of First Embodiment. In FIG. 5, CPU represents a microprocessor. The microprocessor CPU operates according to a program stored in a memory not shown in this drawing. During operation, predetermined processing is carried out by sending or receiving data among the semiconductor chips CH1 to CH5, for example, via digital interface circuits, bump electrodes in the interface bump electrode region DF (FIG. 4) corresponding to the digital interface circuits, and wirings in wiring layers. In addition, the microprocessor CPU sends or receives signals according to a program between the semiconductor device SIP and outside thereof via high-speed interface circuits and bump electrodes in the interface bump electrode regions AF1 to AF9 (FIG. 4) corresponding to the high-speed interface circuits.

The semiconductor chip CH is equipped with, in addition to the microprocessor, a plurality of digital interface circuits corresponding to the interface bump electrode region DF and high-speed interface circuits corresponding to the interface bump electrode regions AF1 to AF, each described referring to FIG. 4. FIG. 5 omits the digital interface circuit. As a typical example of the high-speed interface circuit, only a high-speed interface circuit corresponding to the interface bump electrode region AF2 described in FIG. 4 is shown.

The bump electrodes arranged in the interface bump electrode region AF2 correspond to the interface circuit of USB 3.0 standard. As described above, the interface bump electrode region AF2 also has therein bump electrodes corresponding to the interface circuit of USB 2.0 standard and the interface circuit of USB 1.1 standard in order to maintain compatibility. In FIG. 5, IF-U11 represents an interface circuit of USB 1.1 standard; IF-U20 represents an interface circuit of USB 2.0 standard; and IF-U30 represents an interface circuit of USB 3.0 standard. In addition, in FIG. 5, CC represents a capacitor and SW represents a switch. The switch SW and capacitor CCD are used when the characteristic of the interface circuit IF-U30 is regulated. Regulation using the switch SW and the capacitor CC will be described later so that it is not described here.

The interface circuit IF-U30 of USB 3.0 standard, has coupling to the analog-power-supply bump electrode BD-A30 and signal bump electrodes BD-T−, BD-T+, BD-R−, and BD-R+. The interface circuit IF-U20 of USB 2.0 standard has coupling to an analog-power-supply bump electrode BD-A20 and signal bump electrodes BD-I− and BD-I+. The interface circuit IF-U11 of USB 1.1 standard has coupling to an analog power supply bump electrode BD-A11 and signal bump electrodes BD-I− and BD-I+.

The interface circuit IF-U30 is equipped with a differential circuit that operates with an analog power supply voltage supplied to the analog-power-supply bump electrode BD-A30 as an operation voltage. When data are sent from the interface circuit IF-U30 to the outside of the semiconductor chip CH, the data to be sent, for example, from the microprocessor CPU is supplied to the interface circuit IF-U30. The differential circuit that is provided in the interface circuit IF-U30 and operates at an analog power supply voltage forms a pair of differential signals according to the data to be sent and outputs them to the signal bump electrodes BD-T−, BD-T+. The pair of differential signals input into the signal bump electrodes BD-R−, BD-R+ is, on the other hand, supplied to a differential circuit that is provided in the interface circuit IF-U30 and operates at an analog power supply voltage, amplified in the differential circuit, and supplied, for example, to the microprocessor CPU as an output of the interface circuit IF-U30. In this case, the maximum data transfer rate of the data output from or input to the interface circuit IF-U30 becomes a value conforming to USB 3.0 standard. In FIGS. 4 and 5, in order to prevent the drawing from becoming complicated, the signal bump electrodes BD-T−, BD-T+ are shown as a single bump electrode, but they are two signal bump electrodes for outputting a pair of differential signals. Similarly, the signal bump electrodes BD-R−, BD-R+ are shown as one bump electrode, but they are two signal bump electrodes for inputting a pair of differential signals.

The interface circuit IF-U20 is also equipped with a differential circuit that operates with an analog power supply voltage supplied to the analog-power-supply bump electrode BD-A20 as an operation voltage. When data are sent from the interface circuit IF-U20 to the outside of the semiconductor chip CH, the data to be sent, for example, from the microprocessor CPU is supplied to the interface circuit IF-U20. The differential circuit that is provided in the interface circuit IF-U20 and operates at an analog power supply voltage forms a pair of differential signals according to the data to be sent and outputs them to the signal bump electrodes BD-I−, BD-I+. The pair of differential signals input to the signal bump electrodes BD-I− and BD-I+ is, on the other hand, supplied to a differential circuit that is provided in the interface circuit IF-U20 and operates at an analog power supply voltage, amplified in the differential circuit, and supplied, for example, to the microprocessor CPU as an output of the interface circuit IF-U20. In this case, the maximum data transfer rate of the data output from or input to the interface circuit IF-U20 becomes a value conforming to USB 2.0 standard.

Similarly, the interface circuit IF-U11 is also equipped with a differential circuit that operates with an analog power supply voltage supplied to the analog-power-supply bump electrode BD-A11 as an operation voltage. When data are sent from the interface circuit IF-U11 to the outside of the semiconductor chip CH, the data to be sent, for example, from the microprocessor CPU is supplied to the interface circuit IF-U11. The differential circuit that is provided in the interface circuit IF-U11 and operates at an analog power supply voltage forms a pair of differential signals according to the data to be sent and outputs them to the signal bump electrodes BD-I−, BD-I+. The pair of differential signals input to the signal bump electrodes BD-I−, BD-I+ is, on the other hand, supplied to a differential circuit that is provided in the interface circuit IF-U11 and operates at an analog power supply voltage, amplified in the differential circuit, and supplied, for example, to the microprocessor CPU as an output of the interface circuit IF-U11. In this case, the maximum data transfer rate of the data output from or input to the interface circuit IF-U11 becomes a value conforming to USB 1.1 standard.

As described above, the analog power supply voltage for USB 3.0 is 0.8V, that for USB 2.0 is 1.8V, and that for USB 1.1 is 3.3V. This means that respectively different analog power supply voltages corresponding to differential signals based on these standards (kinds) are supplied to the analog-power-supply bump electrodes BD-A30, BD-A20, and BD-A11, respectively. In First Embodiment, the interface circuits IF-U20 and IF-U11 share the signal bump electrodes BD-I− and BD-I+. For example, the microprocessor CPU determines for which the signal bump electrodes BD-I− and BD-I+ are used, the interface circuit IF-U20 or the interface circuit IF-U11.

Figure 6A:
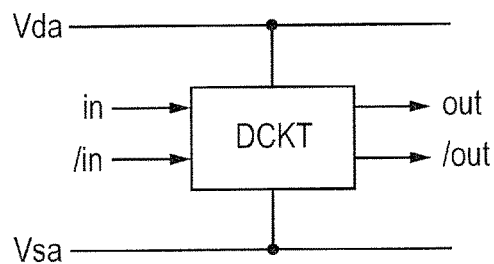
FIGS. 6A to 6D each show the constitution of a circuit of First Embodiment.
Figure 6B:
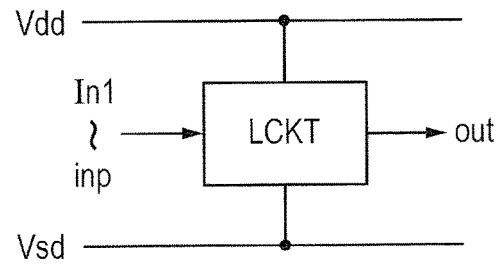
Figure 6C:
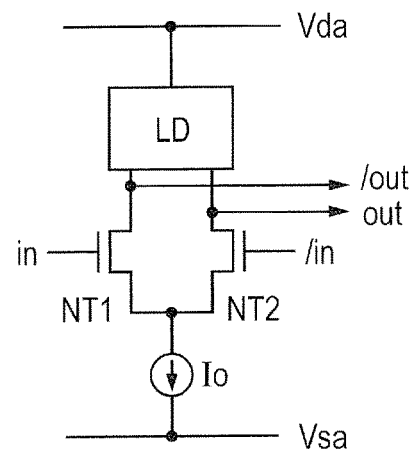
Figure 6D:
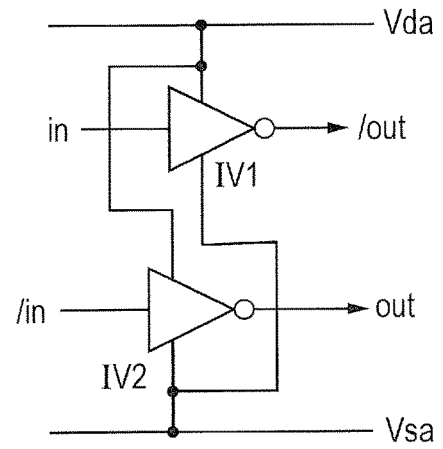

FIG. 6A is a block diagram showing the constitution of a differential circuit used for the interface circuits IF-U30, IF-U20, IF-U11, or the like of First Embodiment. FIG. 6B is a block diagram showing the constitution of a logic circuit to be used in the microprocessor CPU or the like. FIGS. 6C and 6D are block diagrams showing the constitution example of a differential circuit.

The microprocessor CPU includes a logic circuit such as NAND circuit and OR circuit. These circuits operate at a digital power supply voltage. When the logic circuit is described using that shown in FIG. 6B as an example, a logic circuit LCKT is supplied with a digital ground voltage Vsd and a digital power supply voltage Vdd and it operates at a digital power supply voltage Vdd as an operation voltage. According to the example shown in FIG. 6B, the logic circuit LCKT carries out logic operation among single-phase input signals in1 to inp and an operation result is output as out. The digital power supply voltage Vdd is supplied via the bump electrodes BD described referring to FIG. 4.

The differential circuit, on the other hand, operates as shown in FIG. 6A. Described specifically, a differential circuit DCKT is supplied with an analog ground voltage Vsa and an analog power supply voltage Vda and it operates with the analog power supply voltage Vda as an operation voltage. The differential circuit DCKT operates, forms output signals out,/out (reverse phase of out) according to a difference in a pair of differential signals (complementary signals) in,/in (reverse phase of in) and outputs them.

For example, as shown in FIG. 6(C), the differential circuit DCKT is equipped with a pair of differential transistors (MOSFET) NT1 and NT2, a constant current circuit To, and a load circuit LD. The analog ground voltage Vsa is supplied to the source of the differential transistors NT1 and NT2 via the constant current circuit To and the analog power supply voltage Vda is supplied to the drain of each of the differential transistors NT1 and NT2 via the load circuit LD. Signals out,/out formed according to a difference in the pair of differential signals in,/in are output. A pseudo differential circuit is another example of the differential circuit DCKT. The constitution example of the pseudo differential circuit is shown in FIG. 6D. The pseudo differential circuit is equipped with a pair of inverter circuits IV1 and IV2 that is supplied with with an analog ground voltage Vsa and an analog power supply voltage Vda, respectively, and operates at the analog power supply voltage Vda. A pair of differential signals in, /in is supplied to the inverters IV1 and IV2 to form output signals out, /out that show a differential change and these output signals are output.

For example, the interface circuits IF-U30, IFU-20, and IFU-11 are each provided with two differential circuits DCKT shown in FIG. 6A. With respect to the interface circuit IF-U30 as an example, out, /out of one of the two differential circuits are, as a pair of differential signals, output to the signal bump electrodes BD-T−, BD-T+. The pair of differential signals input to the signal bump electrodes BD-R−, BD-R+ are, as differential signals in, /in, supplied to the other differential circuit.

Using a pair of differential signals as an interface signal enables determination of data based on a difference between signals and as a result, a high-speed interface circuit can be achieved. The interface circuit used in First Embodiment therefore serves as a high-speed interface circuit capable of high-speed data transfer.

Thus, in the present specification, a power supply voltage that operates a differential circuit is called "analog power supply voltage" and a power supply voltage that operates a logic circuit is called "digital power supply voltage".

<Constitution of Wiring Board>

Figure 7:
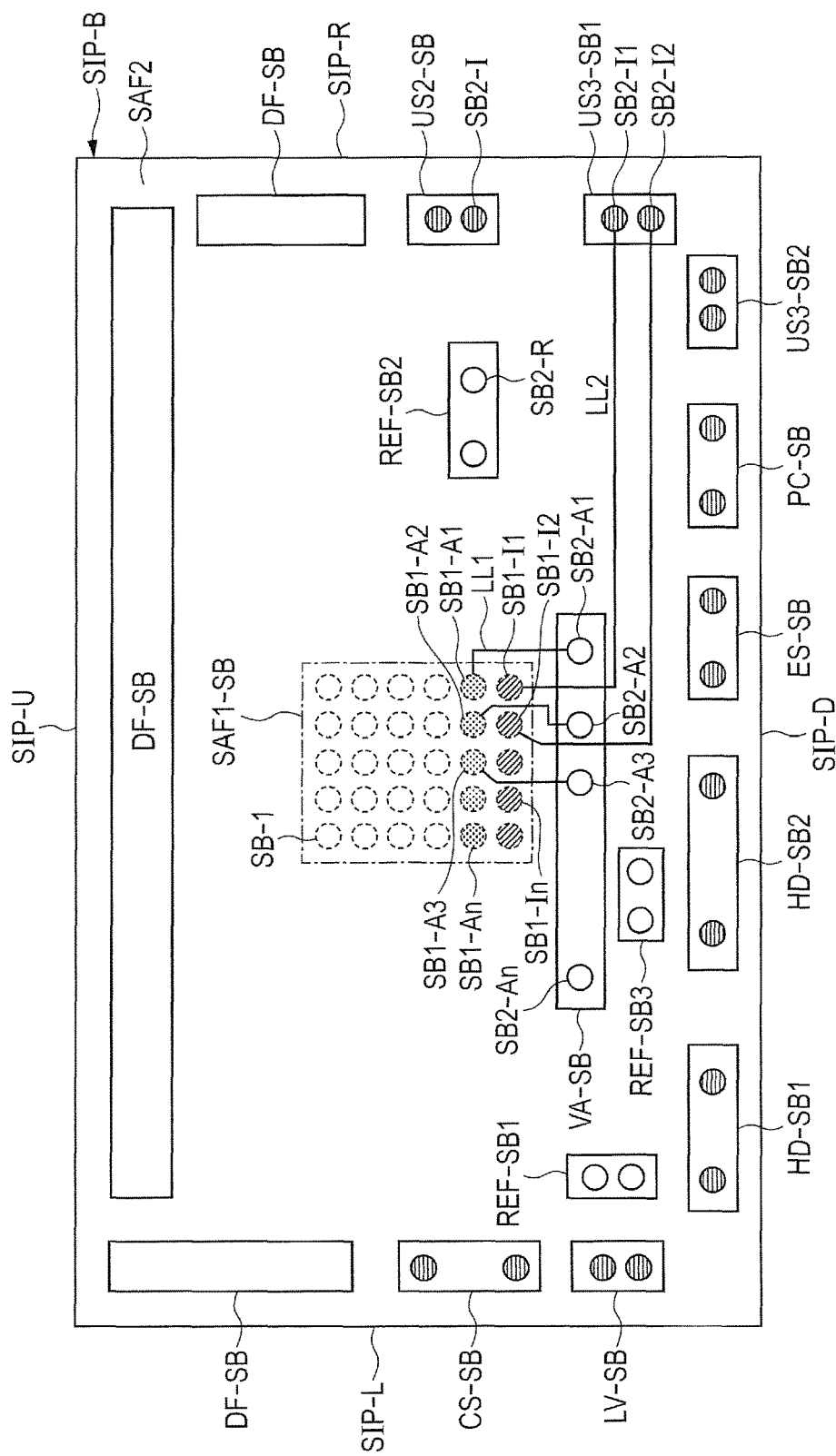
FIG. 7 is a plan view of the wiring board of First Embodiment.

Next, the constitution of the wiring board SIP-B will be described referring to FIG. 7. FIG. 7 is a plan view of the wiring board SIP-B of First Embodiment when the wiring board SIP-B is viewed from the side of the second main surface SAF2. In this drawing, SIP-U, SIP-D, SIP-R, and SIP-L are sides of the wiring board SIP-B, that is, sides of the first main surface SAF1 and the second main surface SAF2. Although no particular limitation is imposed, the sides SIP-U and SIP-D extend in parallel to each other and the sides SIP-R and SIP-L also extend in parallel to each other. The sides SIP-U and SIP-D and the sides SIP-R and SIP-L are orthogonal to each other. In other words, the first main surface SAF1 and the second main surface SAF2 have, around them, the sides SIP-U, SIP-D, SIP-R, and SIP-L.

As described above, the wiring board SIP-B has, on the first main surface SAF1 and the second main surface SAF2 thereof, first external terminals and second external terminals, respectively. In FIG. 7, among first external terminals formed on the first main surface SAF1, first external terminals coupled to the bump electrodes BD, BD-A30, BD-A20, BD-A11, BD-T−, BD-T+, BD-R−, BD-R+, BD-I−, BD-I+ and the like (FIGS. 4 and 5) via a bump are indicated by a broken-line circle. Since the wiring board SIP-B is viewed from the side of the second main surface SAF2 in FIG. 7, the first external terminals indicated by a broken-line circle are viewed through the wiring board SIP-B.

In FIG. 7, the region SAF1-SB indicated by a dashed-dotted line is a region of the first main surface SAF1 and the semiconductor chip CH is mounted on the wiring board SIP-B so that in this region SAF1-SB, the first main surface SAF1 and the main surface SAF of the semiconductor chip CH face to each other. Then, the first external terminals (broken-line circle) formed in the region SAF1-SB indicated by a dashed-dotted line are electrically coupled to bump electrodes corresponding thereto formed on the main surface SAF of the semiconductor chip CH. In other words, the region SAF1-SB can be regarded to show the position of the first main surface SAF1 of the wiring board SIP-B on which the semiconductor chip CH is mounted.

The semiconductor chip CH is mounted so that the side EU (FIG. 4) of the semiconductor chip CH and the side SIP-U of the wiring board SIP-B face to each other and the side ED (FIG. 4) of the semiconductor chip CH and the side SIP-D of the wiring board SIP-B face to each other. In addition, it is mounted so that the side ER (FIG. 4) of the semiconductor chip CH and the side SIP-R of the wiring board SIP-B face to each other and the side EL (FIG. 4) of the semiconductor chip CH and the side SIP-L of the wiring board SIP-B face to each other.

The region SAF1-SB indicated by a dashed-dotted line has therein a plurality of two-dimensionally (planarly) and regularly arranged first external terminals. In FIG. 7, the first external terminals arranged in the region SAF1-SB are shown as first external terminals SB-1 indicated by a broken-line blank circle, first external terminals SB1-A1 to SB-An indicated by a broken-line circle filled with dots, and first external terminals SB1-I1 to SB1-In indicated by a broken-line circle filled with right downward oblique lines. The first external terminals SB1-A1 to SB1-An are analog-power-supply-voltage first external terminals and the first external terminals SB1-I1 to SB1-In are signal first external terminals. The first external terminals SB1 are drawn for showing that the region SAF1-SB has therein a plurality of first external terminals.

As described above in FIG. 4, the semiconductor chip CH has, along the side ED and a portion of the side ER of the main surface SAF thereof, bump electrodes corresponding to high-speed interface circuits. This means that there are signal bump electrodes (BD-T−, BD-T+, BD-R−, and BD-R+ in the example of FIG. 4) and analog-power-supply bump electrodes (BD-A30 in the example of FIG. 4) of the high-speed interface circuits along the side ED and a portion of the side ER and in the vicinity of each side. Although no particular limitation is imposed, the signal bump electrodes are arranged closer to the sides than the analog-power-supply bump electrodes.

The region SAF1-SB has, along the bottom side thereof corresponding to the side ED of the semiconductor chip CH, signal first external terminals SB1-I1 to SB1-In and has, along the bottom side of the region SAF1-SB, analog-power-supply-voltage first external terminals SB1-A1 to SB1-An so as to sandwich the signal first external terminals SB1-I1 to SB1-In between them. When the semiconductor chip CH is mounted on the wiring board SIP-B, these signal first external terminals SB1-I1 to SB1-In are coupled, via a bump, to the signal bump electrodes (for example, BD-T−, BD-T+, BD-R−, and BD-R+) arranged along the side ED and a portion of the side ER of the semiconductor chip CH. Similarly, the analog-power-supply-voltage first external terminals SB1-A1 to SB1-An are coupled, via a bump, to the analog-power-supply bump electrodes (for example, BD-A30) arranged along the side ED and a portion of the side ER of the semiconductor chip CH. Some of the first external terminals SB-1 shown as an example are coupled to the bump electrodes BD shown in FIG. 4. A digital power supply voltage is supplied to the bump electrodes BD of FIG. 4 via the first external terminals SB-1.

The wiring board SIP-B has, on the second main surface SAF2 thereof, a plurality of two-dimensionally arranged second external terminals. In FIG. 7, these second external terminals are classified by function and shown by regions, each surrounded with a solid line. In FIG. 7, DF-SB represents a second external terminal region having therein second external terminals corresponding to digital-signal interface circuits. In FIG. 7, US2-SB, US3-SB1, US3-SB2, PC-SB, ES-SB, HD-SB1, HD-SB2, LV-SB, and CS-SB respectively represent second external terminal regions having therein signal second external terminals of a high-speed interface circuit. The signal second external terminals of a high-speed interface circuit are indicated by a circle filled with parallel horizontal lines. In order to show that the second external terminal regions US2-SB, US3-SB1, US3-SB2, PC-SB, ES-SB, HD-SB1, HD-SB2, LV-SB, and CS-SB corresponding to high-speed interface circuits are each equipped therein with a plurality of second external terminals, regions each having therein two signal second external terminals SB2-I are drawn in FIG. 7. It is needless to say that the number of the signal second external terminals in the second external terminal region varies depending on the kind of the interface circuit.

The signal second external terminals (not shown) placed in the second external terminal region DF-SB correspond to bump electrodes in the interface bump electrode region DF shown in FIG. 4. The second external terminals SB2-I in the second external terminal regions US2-SB, US3-SB1, US3-SB2, PC-SB, ES-SB, HD-SB1, HD-SB2, LV-SB, and CS-SB correspond to signal bump electrodes in the interface bump electrode regions AF-1 to AF-9 shown in FIG. 4, respectively. The signal second external terminals SB2-I in the second external terminal regions DF-SB, US2-SB, US3-SB1, US3-SB2, PC-SB, ES-SB, HD-SB1, HD-SB2, LV-SB, and CS-SB are electrically coupled to the first external terminals arranged in the region SAF1-SB via a metal wiring in the wiring board SIP-B and coupled to corresponding bump electrodes via the first external terminals.

FIG. 7 shows an electrically coupled example of the second external terminals SB2-I1 and SB2-I2 arranged in the second external terminal region US3-SB1 to the first external terminals SB1-I1 and SB1-I2 via metal wirings LL2, respectively. These first external terminals SB1-I1 and SB1-I2 have coupling to corresponding bump electrodes by a bump. Second external terminals SB2-I arranged in the other second external terminal regions are also electrically coupled to signal first external terminals arranged in the region SAF1-SB via an appropriate metal wiring arranged in the wiring board SIP-B and these signal first external terminals are coupled to corresponding bump electrodes.

The interface bump electrode region AF-2 has therein signal bump electrodes of the interface circuit of USB 3.0 standard. Second external terminals arranged in the second external terminal region US3-SB1 corresponding to the interface bump electrode region AF-2 serve as signal second external terminals of an interface circuit of USB 3.0 standard. This means that the second external terminals SB2-I1 and SB2-I2 in the second external terminal region US3-SB1 correspond to signal bump electrodes of an interface circuit of USB 3.0 standard. When the semiconductor chip CH is mounted on the wiring board SIP-B, for example, the signal bump electrode BD-T−, BD-T+, or BD-R−, BD-R+ is coupled to the first external terminals SB1-I1 via a bump and the signal bump electrode BD-I− or BD-I+ is coupled to the first external terminal SB1-I2 via a bump. As a result, output, input, or input/output of the interface circuit of USB 3.0 standard is coupled to the second external terminals SB2-I1 and SB2-I2 arranged in the second external terminal region US3-SB1.

Although no particular limitation is imposed, the second external terminal SB2-I in the second external terminal region US2-SB corresponds to a signal bump electrode of an interface circuit of USB 2.0 standard and an interface circuit of USB 1.1 standard. The second external terminal SB2-I in the second external terminal region US3-SB2 corresponds to a signal bump electrode of an interface circuit of USB 3.0 and the second external terminal SB2-I in the second external terminal region PC-SB corresponds to a signal bump electrode of an interface circuit of PCIe standard. The second external terminal in the second external terminal region ES-SB corresponds to a signal bump electrode of an interface circuit of eSATA technology, and the second external terminal in the second external terminal regions HD-SB1 and HD-SB2 correspond to the signal bump electrode of an interface circuit of HDMI standard. Further, the second external terminal SB-2I in the second external terminal region LV-SB corresponds to a signal bump electrode of an interface circuit of LVDS technology, and the second external terminal SB2-I in the second external terminal region CS-SB corresponds to a signal bump electrode of an interface circuit of MIPI-CSI standard.

The signal second external terminals SB2-I arranged in these second external terminal regions are, similar to the second external terminals SB2-I1 and SB2-I2 in the second external terminal region US3-SB1, electrically coupled to signal first external terminals (for example, SB1-I3 to SB1-In) in the region SAF1-SB via a metal wiring in the wiring board SIP-B. Since the semiconductor chip CH is mounted on the wiring board SIP-B and first external terminals arranged in the region SAF1-SB are coupled to the bump electrodes of the semiconductor chip CH via a bump, the second external terminals SB2-I in each of the second external terminal regions are coupled to the output or input of a corresponding interface circuit. The second external terminals arranged in the second external terminal region DF are also coupled to a corresponding interface circuit in the semiconductor chip CH.

In First Embodiment, the second external terminals SB2-I for outputting or inputting signals of a high-speed interface circuit are arranged along and in the vicinity of the side SIP-D and a portion of the side SIP-R of the wiring board SIP-B. This enables users to receive or send, in the user board UR-B (FIG. 2), signals of an interface circuit from the semiconductor device SIP. In particular, a high-speed interface circuit can send or receive signals having a high data transfer rate while using a relatively short wiring.

In FIG. 7, REF-SB1, REF-SB2, and REF-SB3 respectively represent second external terminal regions having therein a second external terminal SB2-R for reference signals to be supplied with a reference voltage or reference signal from the outside of the semiconductor device SIP. In FIG. 7, the second external terminal SB2-R for reference signal is indicated by a blank circle. This second external terminal SB2-R for reference signal also has coupling to the first external terminal in the region SAF1-SB via an appropriate metal wiring layer in the wiring board. When the semiconductor chip CH is mounted on the wiring board SIP-B, it receives reference signals supplied to the second external terminal SB2-R and uses them as reference for operation.

In FIG. 7, VA-SB is a second external terminal region having herein analog-power-supply-voltage second external terminals (SB2-A1 to SB2-An) for operating a high-speed interface circuit and analog-ground-power-supply second external terminals to be supplied with an analog ground voltage Vsa (FIG. 6). In order to prevent the drawing from becoming complicated in FIG. 7, only the analog-power-supply-voltage second external terminals are shown. The analog ground voltage Vsa may be used in common with the digital ground voltage Vsd.

The analog-power-supply-voltage second external terminals SB2-A1 to SB2-An have electrical coupling to the first external terminals SB1-A1 to SB1-An in the region SAF1-SB via an appropriate metal wiring in the wiring board SIP-B. FIG. 7 exemplarily shows respective electrical coupling between the analog-power-supply-voltage second external terminals SB2-A1, SB2-A2 and SB2-A3 and the analog-power-supply-voltage first external terminals SB1-A1, SB1-A2, and SB1-A3 arranged in the region SAF1-SB via the metal wiring LL1 in the wiring board SIP-B. The remaining analog-power-supply-voltage second external terminals SB2-A4 to SB2-An also have electrical coupling to the analog-power-supply-voltage first external terminals SB1-A1 to SB1-An via a metal wiring in the wiring board SIP-B.

When the semiconductor chip CH is mounted in the region SAF1-SB, the analog-power-supply-voltage first external terminals SB1-A1 to SB1-An are electrically coupled, via a bump, to analog-power-supply-voltage bump electrodes of a high-speed interface circuit in the semiconductor chip CH. The following is one example described referring to FIGS. 5 and 7. The analog-power-supply-voltage first external terminal SB1-A1 is coupled to the bump electrode BD-A11 shown in FIG. 5, the analog-power-supply voltage first external terminal SB1-A2 is coupled to the bump electrode BD-A20 shown in FIG. 5, and the analog-power-supply-voltage first external terminal SB1-A3 is coupled to the bump electrode BD-30 shown in FIG. 5.

Thus, in First Embodiment, the signal second external terminals (second external terminals SB2-I1 and SB2-I2 in the second external terminal region US3-SB2) to which signals of high-speed interface circuits (for example, IF-U11, IF-U20, and IF-U30 shown in FIG. 5) are physically separated, on the second main surface SAF2 of the wiring board SIP-B, from the analog-power-supply-voltage second external terminals (SB2-A1 to SB-A3) to be supplied with an analog power supply voltage for operating these interface circuits (IF-U11, IF-U20, and IF-U30). In other words, the signal second external terminals of a high-speed interface circuit and the analog-power-supply-voltage second external terminals that supply a power supply voltage for operating the high-speed interface circuit are not arranged close to each other as a set on the second main surface SAF2 of the wiring board SIP-B, but are separated from each other.

Further, the semiconductor chip CH is mounted so as to face the region SAF1-SB. When the semiconductor chip CH is on the wiring board SIP-B and the wiring board SIP-B is viewed from the side of the second main surface SAF2, the second external terminal region VA-SB having therein the analog-power-supply-voltage second external terminals SB2-A1 to SB2-An are arranged closer to the semiconductor chip CH than the second external terminal regions having therein the signal second external terminals SB-I. The second external terminal regions having therein the signal second external terminals SB-I mean US2-SB, US3-SB1, US3-SB2, PC-SB, ES-SB, HD-SB1, HD-SB2, LV-SB, and CS-SB.

A description will be made using, for example, the second external terminal region US3-SB1 as an example. When the semiconductor chip CH mounted on the wiring board SIP-B is viewed from the side of the second main surface SAF2, the analog-power-supply-voltage second external terminals SB2-A1 to SB2-A3 are second external terminals closer to the semiconductor chip CH than the signal second external terminals SB2-I1 and SB2-I2.

Thus, by making the the analog-power-supply-voltage second external terminals SB2-A1 to SB2-A3 close to the semiconductor chip CH, the metal wiring (LL1) for coupling between the analog-power-supply-voltage first external terminals SB1-A1 to SB-A3 and the analog-power-supply-voltage second external terminals SB2-A1 to SB-A3 can be made shorter than the metal wiring (LL2) for coupling between the signal first external terminals SB1-I1 and SB1-I2 and the signal second external terminals SB2-I1 and SB2-I2. This enables reduction in inductance of the wiring (LL1) for supplying an analog power supply voltage and as a result, generation of malfunctions can be reduced. Although the wiring (LL2) for transmitting signals becomes longer than the wiring for supplying an analog power supply voltage, less delay between signals to be transmitted enables to suppress generation of malfunctions. In this case, the signal second external terminal SB2-I is arranged along the periphery of the semiconductor device SIP, facilitating handling of the device.

In order to prevent the drawing from becoming complicated, only second external terminals necessary for the convenience of the description are shown in FIG. 7, but it should be understood that the wiring board SIP-B has, on the main surface SAF2 thereof, a plurality of second external terminals as well as the second external terminals described above. In addition, FIG. 7 shows, simply for convenience of description, a single column (single row) of the second external terminal group arranged in each of the second external terminal regions, but the number of the columns or rows is not limited to it.

<Detailed Constitution of Wiring Board>

Figure 8:
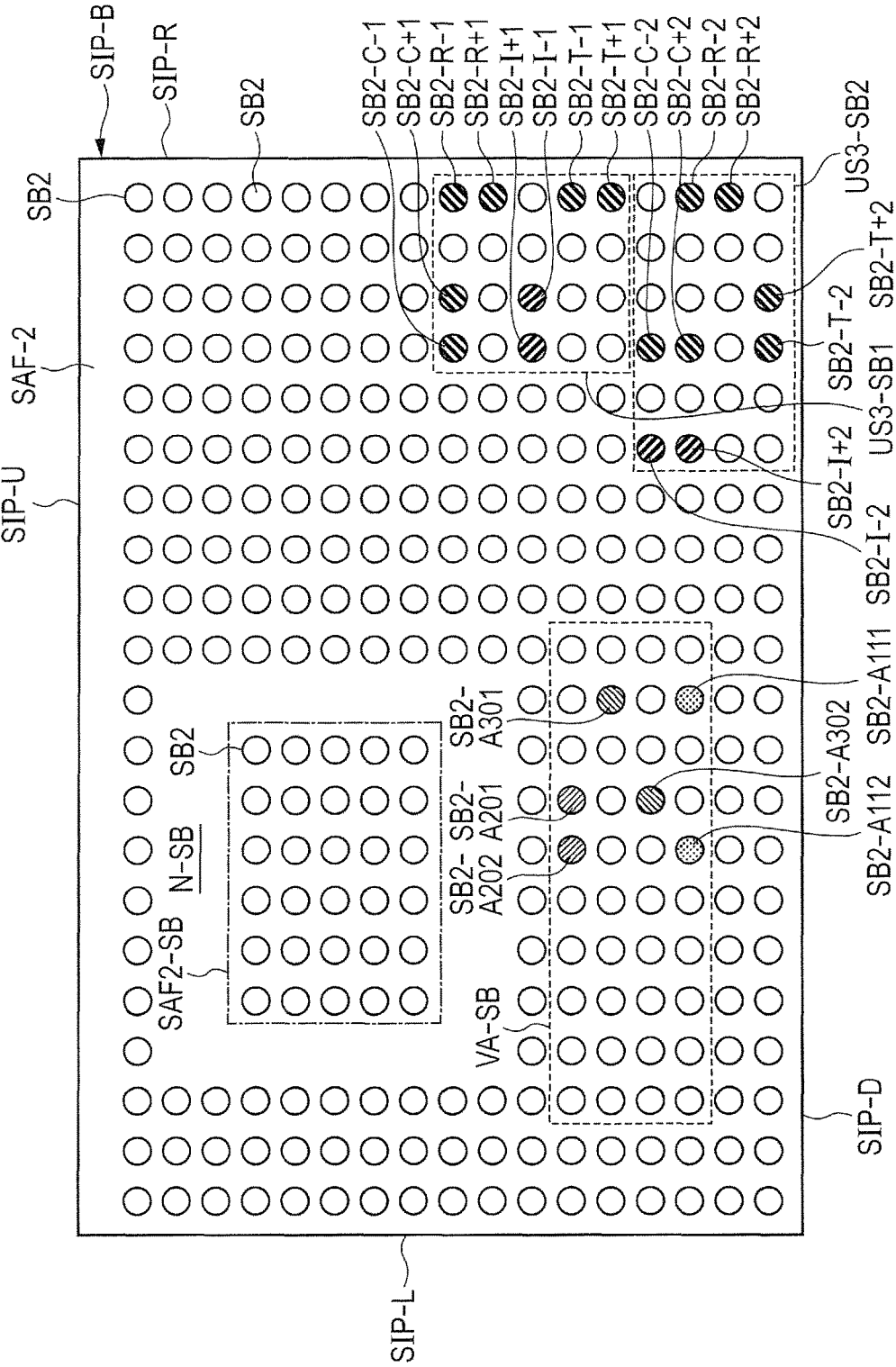
FIG. 8 is a plan view showing the detailed constitution of the wiring board of First Embodiment.

FIG. 8 is a plan view showing the detailed constitution of the wiring board SIP of First Embodiment. FIG. 8 is a plan view of the wiring board SIP-B viewed from the side of the second main surface SAF2. FIG. 8 shows, in detail, the second external terminal regions US3-SB1, US3-SB2, and VA-S shown in the plan view of FIG. 7 and it omits other second external terminal regions. The region SAF2-SB surrounded by a dashed-dotted line in FIG. 7 is a region of the second main surface SAF2 overlapping with the semiconductor chip CH when the semiconductor chip CH mounted on the region SAF1-SB shown in FIG. 7 is viewed from the side of the second main surface SAF2.

In FIG. 8, a circle represents a second external terminal SB2 formed on the wiring board SIP-B. Although no particular limitation is imposed, the second main surface SAF2 is grouped into three regions in First Embodiment. Described specifically, the second main surface SAF2 is equipped with a region SAF2-SB, a blank region N-SB that surrounds the region SAF2-SB and has no second external terminal SB therein, and a second external terminal group region that surrounds the blank region N-SB and has therein a plurality of second external terminals SB2. The second external terminal group region can be regarded as a region having therein a plurality of second external terminals SB2 arranged between the blank region N-SB and the sides SIP-U, SIP-D, SIP-R, and SIP-L of the wiring board SIP-B.

Predetermined second external electrodes, among the second external terminals formed in the second external terminal group region, serve as a second external terminal arranged in each of the second external terminal regions described referring to FIG. 7.

The second external terminals SB2 arranged two-dimensionally (planarly) in the region SAF2-SB have electrical coupling to the first external terminals SB1 that are arranged in the region SAF1-SB shown in FIG. 7 and at the same time, are at the center portion of the region SAF1-SB via a metal wiring in the wiring board SIP-B. When the semiconductor device SIP is mounted on the user board UR-B, a digital power supply voltage is supplied to the second external terminals SB2 arranged in the region SAF2-SB from the user board UR-B. The digital power supply voltage, when described referring to FIG. 6B as an example, includes both a power supply voltage Vdd and a digital ground voltage Vsd. The digital power supply voltage is then supplied to bump electrodes BD arranged at the center portion of the main surface SAF of the semiconductor chip CH mounted on the wiring board SIP-B. Thus, supply of the digital power supply voltage to the circuit block in the semiconductor chip CH can be achieved by a plurality of the second external terminals SB2, a plurality of the first external terminals SB1, and a plurality of the bump electrodes BD. As a result, the semiconductor chip CP can be operated stably.

The blank region N-SB will be described later in Second Embodiment, so it is not described here.

The region surrounded by the broken line VA-SB in FIG. 8 corresponds to the second external terminal region VA-SB in FIG. 7. Second external terminals arranged within the broken line VA-SB are used as second external terminals for supplying an analog power supply voltage to the above-described plurality of high-speed interface circuits. Here, the high-speed interface circuit will be described using interface circuits of USB 3.0 standard, USB 2.0 standard, and USB 1.1 standard as an example. FIG. 8 clearly shows second external terminals for supplying an analog power supply voltage to two-channel interface circuits of USB 3.0 standard, USB 2.0 standard, and USB 1.1 standard.

Described specifically, second external terminals SB2-A301 and SB2-A302 indicated by a circle with right upward oblique lines are analog-power-supply-voltage second external terminals for supplying an analog power supply voltage to the interface circuit of USB 3.0 standard. Second external terminals SB2-A201 and SB2-A202 indicated by a circle with right downward oblique lines are analog-power-supply-voltage second external terminals for supplying an analog power supply voltage to the interface circuit of USB 2.0 standard. Second external terminals SB2-A111 and SB2-

A112 indicated by a circle with dots are analog-power-supply-voltage second external terminals for supplying an analog power supply voltage to the interface circuit of USB 1.1 standard. The interface circuits including the first channel are supplied with an analog power supply voltage by the analog power supply voltage second external terminals SB2-A301, SB2-A201, and SB2-A111, while the interface circuits including the second channel are supplied with an analog power supply voltage by the analog-power-supply-voltage second external terminals SB2-A302, SB2-A202, and SB2-A112.

In FIG. 8, the second external terminal region US3-SB1 has therein signal second external terminals of the interface circuits of USB 3.0 standard, USB 2.0 standard, and USB 1.1 standard including the first channel. This means that the second external terminal region US3-SB1 has therein signal second external terminals of the interface circuit of USB 3.0 standard which is kept compatible with the USB 2.0 standard and the USB 1.1 standard. An analog power supply voltage is supplied to the first-channel interface circuits corresponding to the signal second external terminals arranged in the second external terminal region US3-SB1 from the above-described analog-power-supply-voltage second external terminals SB2-A301, SB2-A201, and SB-A111.

Among the second external terminals SB2 arranged in the second external terminal region US3-SB1, second external terminals SB2-C−1, SB2-C+1, SB2-T−1, SB2-T+1, SB2-R−1, and SB2-R+1 indicated by a circle with right upward thick oblique lines are second external terminals to or from which signals of the interface circuit of USB 3.0 standard are input or output. Second external terminals SB2-I−1 and SB2-I+1 indicated by a circle with right downward thick oblique lines are second external terminals to or from which signals of the interface circuit of USB 2.0 standard and the interface circuit USB 1.1 standard are input or output.

Next, a relationship among the interface circuit IF-U30 of USB 3.0 standard, the interface circuit IF-U20 of USB 2.0 standard, and the interface circuit IF-U11 of USB 1.1 standard, each shown in FIG. 5, will be described.

The analog-power-supply-voltage second external terminal SB2-A301 is coupled to the bump electrode BD-A30, the analog-power-supply-voltage second external terminal SB2-A201 is coupled to the bump electrode BD-A20, and the analog-power-supply-voltage second external terminal SB2-A111 is coupled to the bump electrode BD-A11. The second external terminals SB2-C−1, SB2-C+1, SB2-T−1, SB2-T+1, SB2-R−1, and SB2-R+1 are coupled to the interface circuit IF-U30. To facilitate understanding of the drawing, bump electrode BD-C−(BD-C+) is omitted from FIG. 5, but second external terminals SB2-T−1 (SB2-R−1), SB2-T+1 (SB2-R+1), and SB2-C−1 (SB2-C+1) are coupled to the bump electrodes BD-T− (BD-R−), BD-T+ (BD-R+), and BD-C− (BD-C+) and these signal second external terminals are thereby coupled to the interface circuit IF-U30.

When the interface circuit IF-U30 sends data, a pair of differential signals is formed according to the data to be sent and is then supplied to the bump electrodes BD-T−, BD-T+. The pair of differential signals according to the data to be sent is therefore output from the semiconductor device SIP through the second external terminals SB2-T−1, SB2-T+1. On the contrary, a pair of differential signals supplied from the outside of the semiconductor device is supplied to the second external terminals SB2-R−1, SB2-R+1 and then supplied to the interface circuit IF-U30 via the bump electrodes BD-R−, BD-R+. The analog power supply voltage for operating the interface circuit IF-U30 at this time is therefore supplied via the analog-power-supply-voltage second external terminal SB2-A301 corresponding to the interface circuit IF-U30.

The second external terminals SB2-I−1, SB2-I+1 are coupled to the bump electrodes BD-I−, BDI+.

When the interface circuit IF-U20 sends data, a pair of differential signals is formed according to the data to be sent and is then supplied to the bump electrodes BD-I, BD-I+. The pair of differential signals according to the data to be sent is therefore output from the semiconductor device SIP through the second external terminals SB2-I−1, SB2-I+1. On the contrary, a pair of differential signals supplied from the outside of the semiconductor device is supplied to the second external terminals SB2-I−1, SB2-I+1 and then supplied to the interface circuit IF-U20 via the bump electrodes BD-I− and BD-I+. An analog power supply voltage for operating the interface circuit IF-U20 at this time is therefore supplied via the analog-power-supply-voltage second external terminal SB2-A201 corresponding to the interface circuit IF-U20.

Similarly, when the interface circuit IF-U11 sends data, a pair of differential signals is formed according to the data to be sent and is then supplied to the bump electrodes BD-I−, BD-I+. The pair of differential signals according to the data to be sent is therefore output from the semiconductor device SIP through the second external terminals SB2-I−1, SB2-I+1. On the contrary, a pair of differential signals supplied from the outside of the semiconductor device is supplied to the second external terminals SB2-I−1, SB2-I+1 and then supplied to the interface circuit IF-U11 via the bump electrodes BD-I−, BD-I+. An analog power supply voltage for operating the interface circuit IF-U11 at this time is therefore supplied via the analog-power-supply-voltage second external terminal SB2-A111 corresponding to the interface circuit IF-U11.

In First Embodiment, the semiconductor chip CH is equipped with three interface circuits IF-U302, IF-U202, and IF-U112 having a constitution similar to that of the interface circuits IF-U30, IF-U20, and IF-U11 shown in FIG. 5, a capacitor CC2 similar to the capacitor CC, and a switch SW2 similar to the switch SW. The constitution and coupling of these three interface circuits, the capacitor, and the switch are similar to those shown in FIG. 5. The semiconductor chip has bump electrodes similar to those shown in FIG. 5 and these bump electrodes have coupling, similar to that of FIG. 5, to the interface circuits IF-U302, IF-U202, and IF-U112. Thus, the second-channel interface circuits having such a constitution are formed.

Although no particular limitation is imposed in First Embodiment, signal second external terminals of the second-channel interface circuits are in the second external terminal region US3-SB2. Among the second external terminals SB2 arranged in the second external terminal region US3-SB2, second external terminals SB2-R−2, SB2-R+2, SB2-T−2, SB2-T+2, SB2-C−2, and SB2-C+2 indicated by a circle with right upward thick oblique lines are signal second external terminals of the interface circuit IF-U302 of USB 3.0 standard; and second external terminals SB2-I−2 and SB2-I+2 indicated by a circle with right downward thick oblique lines are signal second external terminals of the interface circuit IF-U202 of USB 2.0 standard and the interface circuit IF-112 of USB 1.1 standard. The constitution and operation of them are similar to those of the first-channel interface circuit so that description on them is omitted here. Also in this case, analog power supply voltages appropriate for these USB standards are supplied to the second-channel interface circuits via the analog-power-supply-voltage second external terminals SB2-A302, SB2-A202, and SB2-A112 arranged in the second external terminal region VA-SB.

In First Embodiment, the semiconductor chip CH is mounted so that the main surface thereof faces the region (SAF1-SB) of the first main surface opposite to the region SAF2-SB. The second external terminal region having therein the analog-power-supply-voltage second external terminals (SB2-A301, SB2-A302, SB2-A201, SB2-A202, SB2-A111, ad SB2-A112) is contiguous to the region SAF2-SB with a single row of the second external terminals SB and the blank region N-SB therebetween. In the example shown in FIG. 8, on the other hand, the second external terminal regions US3-SB1 and US3-SB2 having therein signal second external terminals have, between these regions and the region SAF2-SB, six columns of the second external terminals SB2 and the blank region N-SB. This means that when the semiconductor chip CH is mounted on the wiring board SIP-B and the wiring board SIP-B is viewed from the side of the second main surface SAF2, the analog-power-supply-voltage second external terminals are arranged closer to the semiconductor chip CH than the signal second external terminals are. This makes it possible to shorten the wiring for supplying an analog power supply voltage and thereby reduce inductance.

In First Embodiment, as shown in FIG. 8, when viewed from the second main surface SAF2, the analog-power-supply-voltage second external terminal SB2-A201 is arranged closer to the analog-power-supply-voltage second external terminals SB2-A301 and SB2-A111 than any of the signal second external terminals SB2-C−1 (C+1), SB2-T−1 (R−1), SB2-T+1 (R+1), and SB2-I−1, SB2-I+1. This means that in the wiring board SIP-B, a plurality of analog-power-supply-voltage second external terminals is separated from the signal second external terminals. They are grouped to be close to each other and regarded as an analog-power-supply-voltage second external terminal region. Similarly, signal second external terminals (for example, SB2-I−) are arranged closer to the other signal second external terminals than any of the analog-power-supply-voltage second external terminals. This means that in the wiring board SIP-B, a plurality of signal second external terminals is separated from analog-power-supply-voltage second external terminals. They are grouped to be close to each other and regarded as a signal second external terminal region.

In FIG. 8, as an example of a high-speed interface circuit, interface circuits of USB standard have been described but the high-speed interface circuit is not limited to them. In the above-described various interface circuits, second external terminals arranged closer to the semiconductor chip CH than the signal second external terminals of the interface circuits are used as analog-power-supply second external terminals. This makes it possible to reduce the impedance of a wiring for supplying the interface circuits with an analog power supply voltage and thereby reduce malfunctions in each of the interface circuits.

<Interface Circuits of USB Standards>

The present inventors have investigated, among the above-described several high-speed interface circuits, interface circuits of USB standards further. The investigation made by the present inventors will next be described.

Figure 9:
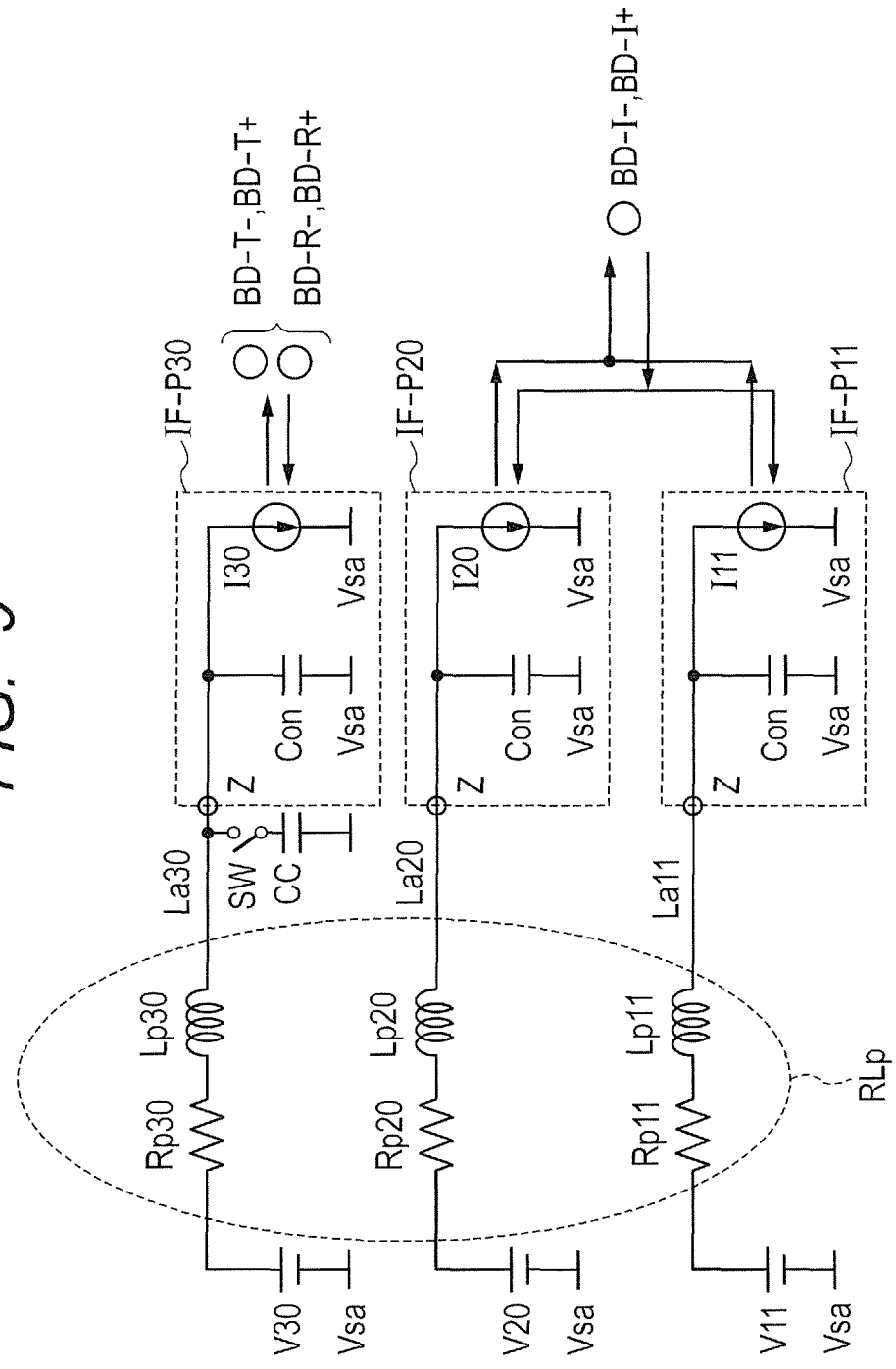
FIG. 9 is a circuit diagram showing the equivalent circuit of an interface circuit of USB standard.

FIG. 9 is a circuit diagram showing, when a semiconductor chip CH having therein an interface circuit of USB standard is mounted on the wiring board SIP-B, an equivalent circuit of the interface circuit.

In FIG. 9, IF-P30 is an equivalent circuit equivalently showing the interface circuit IF-U30 of USB 3.0 standard; and IF-P20 is an equivalent circuit equivalently showing the interface circuit IF-U20 of USB 2.0 standard. Similarly, IF-P11 is an equivalent circuit equivalently showing the interface circuit IF-U11 of USB 1.1 standard.

From the equivalent standpoint of the interface circuit of USB standard, the interface circuit can be regarded to be included of a capacitor coupled in series between an analog ground voltage Vsa and an analog power supply wiring for supplying an analog power supply voltage to the interface circuit and a current source. In this case, the capacitor shows a parasitic capacitance generated, for example, when the interface circuit is formed on the semiconductor chip and a decoupling capacitance coupled positively.

The current source represents an operation current of the interface circuit flowing through the interface circuit when the interface circuit sends or receives data. The operation current represented by the current source varies according to a change in data when the data is sent or received. This means that the current of the current source varies according to a data transfer rate.

The interface circuits IF-U30, IF-U20, and IF-U11 are formed on the same semiconductor chip. Since the interface circuit differs depending on the standard, the value of the capacitor including the equivalent circuit differs among the equivalent circuits IF-P30, IF-P20, and IF-P11 corresponding to the respective interface circuits. In FIG. 9, Con represents the capacitor.

On the other hand, the maximum data transfer rates of the interface circuits IF-U30, IF-U20, and IF-U11 differ from each other as described above. The operation currents of the interface circuits IF-U30, IF-U20, and IF-U11 change with a data transfer rate so that the current source in the equivalent circuit IF-P30 is represented by I30; that in the equivalent circuit IF-P20 is represented by I20; and that in the equivalent circuit IF-P11 is represented by I11.

The current of the current source I30 in the equivalent circuit IF-P30 corresponding to the interface circuit IF-U30 of USB 3.0 standard changes in response to the data transfer rate of signals output from the bump electrodes BD-T−, BD-T+ or signals input into the bump electrodes BD-R−, BD-R+. The current of the current source I20 in the equivalent circuit IF-P20 corresponding to the interface circuit IF-U20 of USB 2.0 standard changes in response to the data transfer rate of signals of the interface circuit IF-U20 output from the bump electrodes BD-I−, BD-I+ or that of signals input into the interface circuit IF-U20 via these bump electrodes.

Similarly, the current of the current source I11 in the equivalent circuit IF-P11 corresponding to the interface circuit IF-U11 of USB 1.1 standard changes in response to the data transfer rate of signals of the interface circuit IF-U11 output from the bump electrodes BD-I−, BD-I+ or signals input into the interface circuit IF-U11 via these bump electrodes.

In FIG. 9, V30, V20, and V11 represent analog power supply voltages to be supplied to the interface circuits, respectively. To facilitate description, the analog power supply voltages V30, V20, and V11 are assumed to be an ideal analog power supply voltage having no output impedance or the like. As described above, analog power supply voltages supplied to the interface circuits are different from one another among USB 3.0 standard, USB 2.0 standard, and USB 1.1 standard. These analog power supply voltages V30, V20, and V11 are supplied to corresponding analog-power-supply-voltage second external terminals in the second main surface SAF2 of the wiring board SIP-B. Referring to FIG. 8 as an example, the analog power supply voltage V30 is supplied to the analog-power-supply-voltage second external terminal SB2-A301 (SB2-A302) and the analog power supply voltage V20 is supplied to the analog-power-supply-voltage second external terminal SB2-A201 (SB2-A202). Similarly, the analog power supply voltage V11 is supplied to the analog-power-supply-voltage second external terminal SB2-A111 (SB2-A112).

In FIG. 9, La30 represents an analog power supply wiring that couples the second external terminal SB2-A301 to the interface circuit IF-U30, La20 represents an analog power supply wiring that couples the second external terminal SB2-A201 to the interface circuit IF-U20, and La11 represents an analog power supply wiring that couples the second external terminal SB2-A111 to the interface circuit IF-U11.

These analog power supply wirings La30, La20, and La11 that couple between the analog-power-supply-voltage second external terminals and the interface circuits corresponding thereto are different from one another in length because the positions of the analog-power-supply-voltage second external terminals in the second main surface SAF2 are different. The analog power supply wirings La30, La20, and La11 each have parasitic resistance and parasitic inductance. Due to difference in length, the analog power supply wirings La30, La20, and La11 inevitably have respectively different parasitic resistance and parasitic inductance. In FIG. 9, Rp30 represents the parasitic capacitance of the analog power supply wiring La30 and Lp30 represents the parasitic inductance. Rp20 represents the parasitic resistance of the analog power supply wiring La20 and Lp20 represents the parasitic inductance. Similarly, Rp11 represents the parasitic resistance of the analog power supply wiring La11 and Lp11 represents the parasitic inductance.

The analog power supply wirings La30, La20, and La11 are each included of an analog power supply wiring in the semiconductor chip CH and an analog power supply wiring included of a metal wiring or the like in the wiring board SIP-B. In this case, the analog power supply wiring included of a metal wiring or the like is longer than the analog power supply wiring in the semiconductor chip. The parasitic resistance Rp30, Rp20, and Rp11 and parasitic inductance Lp30, Lp20, and Lp11 of the analog power supply wirings La30, La20, and La11 therefore correspond to parasitic resistance and parasitic inductance of the analog power supply wiring included of a metal wiring mainly in the wiring board SIP-B, respectively.

Operation current of each of the interface circuits IF-U30, IF-U20, and IF-U11 changes according to the data transfer rate, as described above. The current of each of the current sources I30, I20, and I11 is therefore presumed to change with frequency depending on the data transfer rate.

With respect to the interface circuit IF-U30, a resonant circuit is substantially included of capacitor Con, parasitic inductance Lp30, and parasitic resistance Rp30. Impedance Z at the power supply end portion of the interface circuit IF-U30 is determined by the impedance of this resonant circuit. The impedance Z at the power supply end portion of the interface circuit IF-U30 therefore changes, depending on the data transfer rate of the interface circuit IF-U30. Similarly, in the interface circuit IF-U20, a resonant circuit is included of capacitor Con, parasitic inductance Lp20, and parasitic resistance Rp20. Impedance Z at the power supply end portion of the interface circuit IF-U20 changes, depending on the data transfer rate of the interface circuit IF-U20. Also in the interface circuit IF-U11, a resonant circuit is included of capacitor Con, parasitic inductance Lp11, and parasitic resistance Rp11. Impedance Z at the power supply end portion of the interface circuit IF-U11 changes, depending on the data transfer rate of the interface circuit IF-U11.

Figure 10:
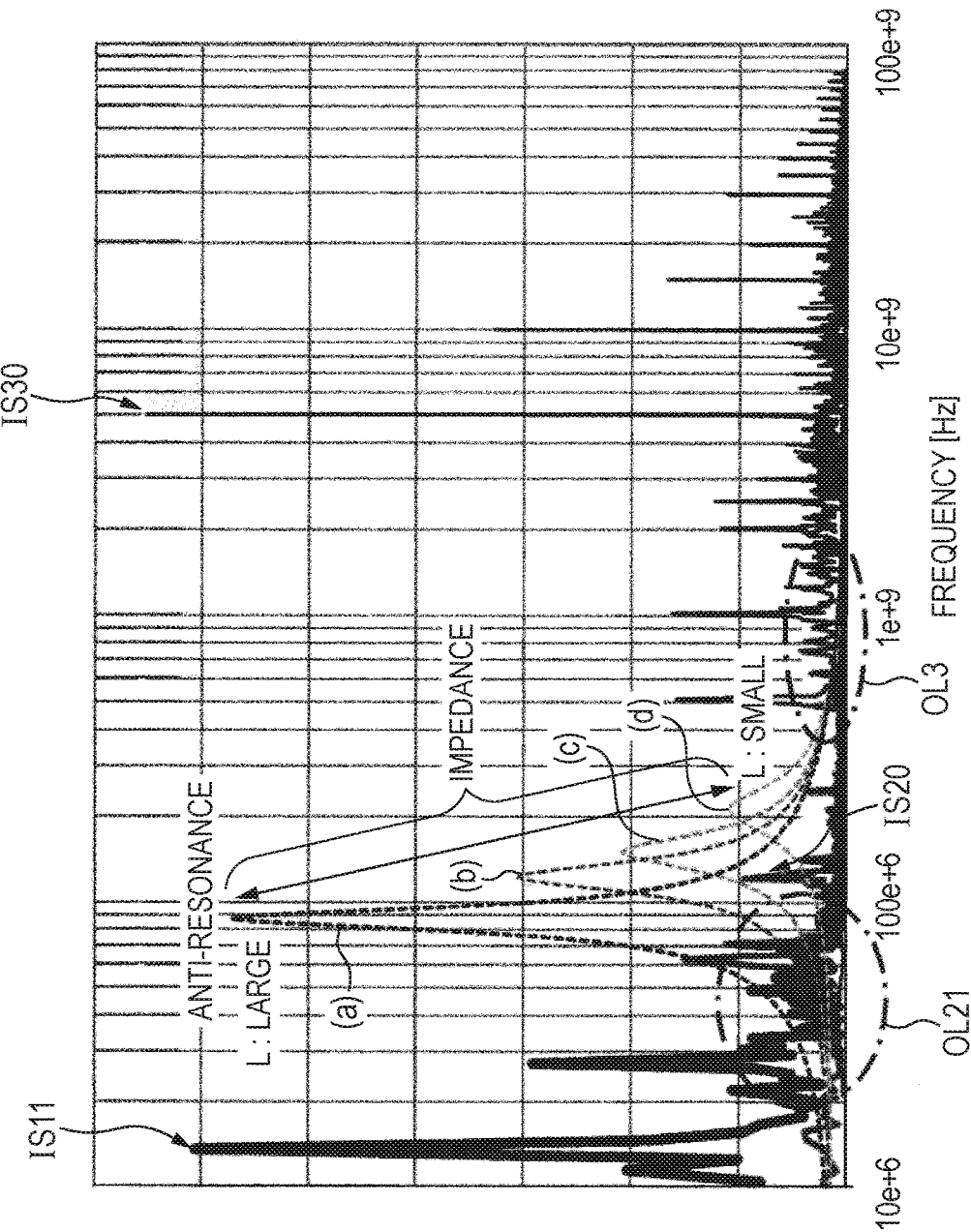
FIG. 10 is a characteristic chart of the interface circuit.

FIG. 10 is a characteristic diagram showing the characteristic of the interface circuits IF-U30, IF-U20, and IF-U11 measured by the present inventors. In FIG. 10, frequency is plotted along the abscissa, while current and impedance are plotted along the ordinate.

In FIG. 10, a fine solid line IS30 shows a power supply current spectrum of the interface circuit IF-U30 of USB 3.0 standard, while a pale solid line IS20 shows a power supply current spectrum of the interface circuit IF-U20 of USB 2.0 current. A thick solid line IS11 is a power supply current spectrum when the interface circuit IF-U11 of USB 1.1 standard operates in FS mode. As described above, the data transfer rate (SS mode) of USB 3.0 standard is 5 Gbps/s, the data transfer rate (HS mode) of USB 2.0 standard is 480 Mbps/s, and the data transfer rate (FS mode) of USB 1.1 standard is 12 Mbps/s. Operation current of each of the interface circuits changes depending on their data transfer rates. As shown in FIG. 10, therefore, the frequency at which the power supply current spectrum reaches a peak is higher in the order of the interface circuits IF-U11, IF-U20, and IF-U30.

The parasitic inductance Lp30, Lp20, and Lp11 and the capacitor Con shown in FIG. 9 are about several nH and about several hundred pF, respectively, supposing that the analog power supply wirings La30, La20, and La11 have the same length. The present inventors determined the impedance of the resonant circuits at the time when the parasitic inductances Lp30, Lp20, and Lp11 are changed. Broken lines (a) to (d) in FIG. 10 show the impedance of the resonant circuits when the values L of the parasitic impedance Lp30, Lp20, and Lp11 are decreasingly changed.

It is apparent from FIG. 10 that changing of the value L of parasitic impedance from a small value (d) to a large value (a) transfers an antiresonance point at which the impedance of the resonant circuit reaches a peak to lower frequency. It is also understood that the smaller the value L of parasitic inductance, the smaller the impedance of the antiresonance point.

Further, it is apparent that the frequency band at which the power supply current spectrum increases in the interface circuit IF-U11 of USB 1.1 standard (FS mode), the frequency band at which the power supply current spectrum increases in the interface circuit IF-U20 of USB 2.0 standard, and the frequency band at which the impedance of the resonance circuit increases overlap with one another (a region surrounded by a broken line OL21). It is apparent, on the other hand, that the frequency band at which the power supply current spectrum increases in the interface circuit IF-U30 of USB 3.0 standard is separated from the frequency band at which the impedance of the resonant circuit increases.

The increase in the impedance of the resonant circuit means an increase in impedance Z at the power supply end portion of the interface circuits IF-U30, IF-U20, and IF-U11. The increase in the power supply current spectrum means an increase in variation of the current flowing through the power supply end portion of the interface circuit. In a region where the broken line and the solid line overlap with each other in FIG. 10, voltage variation occurs at the power supply end portion of the interface circuit due to a change in operation current caused by data transfer. The greater the overlapping region, the greater the voltage variation.

In the interface circuit IF-U30 of USB 3.0 standard capable of higher-speed data transfer, among USB standards, the frequency band at which the power supply current spectrum IS30 increases is separated from the standpoint of frequency from the frequency band at which impedance change occurs by changing parasitic inductance. Even in an overlapping region (region surrounded by a dashed-dotted line OL3), the overlapping area is small. By decreasing the parasitic inductance, on the other hand, the antiresonance point can be transferred to the frequency higher than the frequency at which the power supply current spectrum of each of the interface circuits IF-U20 and IF-U11 reaches a peak. In addition, the impedance at the antiresonance point can be decreased.

It is ordinarily thought to make the power supply wiring Lp30 that supplies an analog power supply voltage to the interface circuit IF-U30 of USB 3.0 standard having a higher data transfer rate shorter than the power supply wiring of the interface circuit IF-U20 having a low data transfer rate, but shortening of the power supply wiring Lp30 has been found ineffective for the improvement of voltage variation at the power supply end portion. Rather, it has been found that shortening of the power supply wiring Lp30 and/or Lp11 of the interface circuit of USB 2.0 standard and/or USB 1.1 standard having a data transfer rate lower than that of USB 3.0 standard and thereby decreasing the parasitic inductance is effective for reducing voltage variation at the power supply end portion of the interface circuit.

Figure 11:
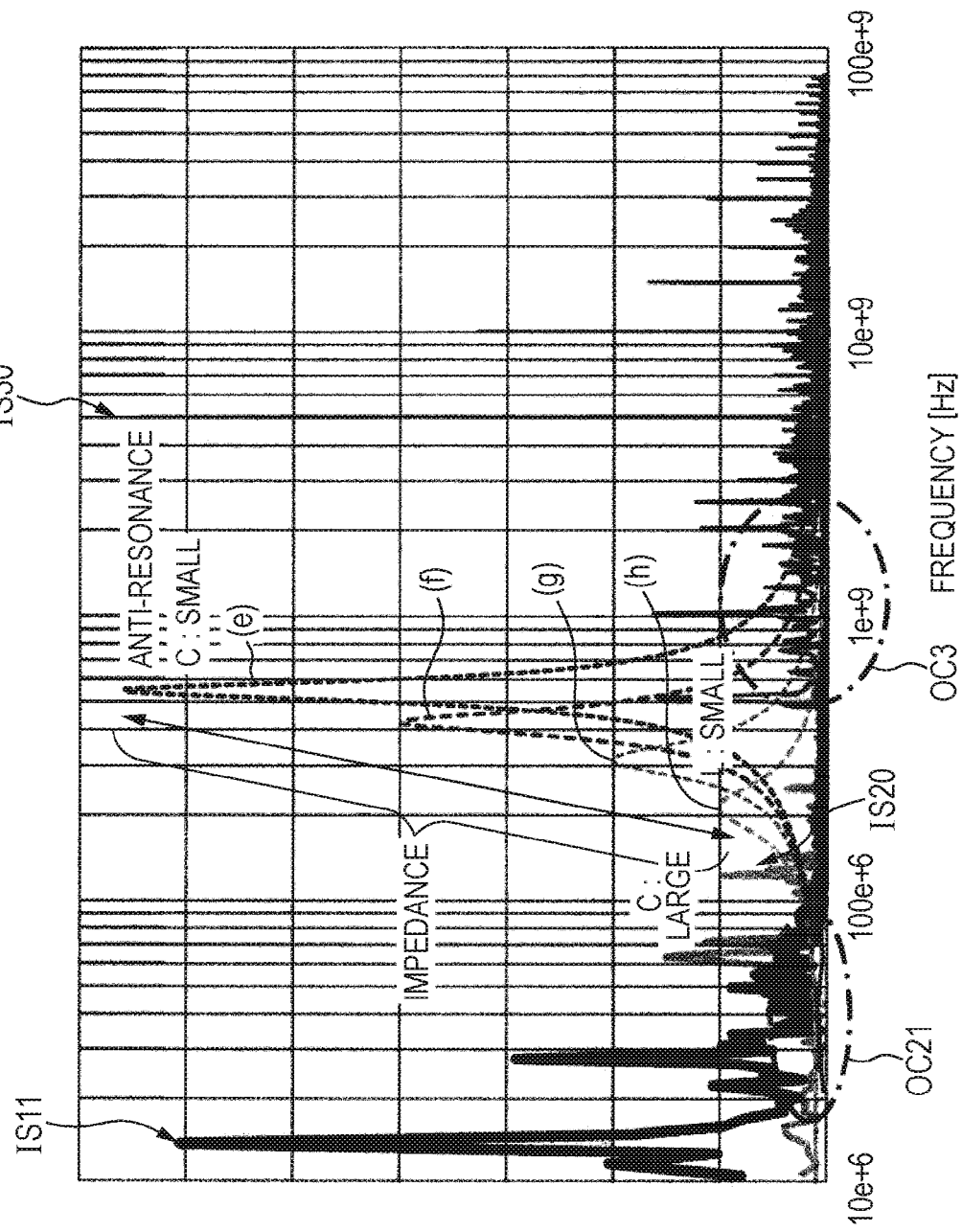
FIG. 11 is a characteristic chart of the interface circuit.

FIG. 11 is, similar to FIG. 10, a characteristic diagram showing the characteristic measured by the present inventors. Also in FIG. 11, frequency is plotted along the abscissa and current and impedance are plotted along the ordinate. In FIG. 11, a thick solid line IS11, a pale solid line IS20, and a fine solid line IS30 are similar to those shown in FIG. 10 so that description on them is omitted.

In FIG. 10, the characteristic of the resonant circuit is changed by changing the parasitic inductance. In FIG. 11, on the other hand, the characteristic of the resonant circuit is changed by changing the value C of capacitor Con. In FIG. 11, the broken lines (e) to (h) show a change in impedance of the resonant circuit when the value of the capacitor Con is changed. When the value C of the capacitor Con is changed from a small value to a large value, the impedance of the resonant circuit changes from the broken line (e) to the broken line (h).

As is understood from FIG. 11, by increasing the value C of the capacitor Con, the frequency of the antiresonance point at which the impedance of the resonant circuit reaches a peak transfers to a lower value and also the impedance decreases. The power supply current spectra IS11 and IS20 in the interface circuit of USB 1.1 standard and the interface circuit of USB 2.0 standard and the impedance curves (e) to (h) overlap with one another in a region encircled by a dashed-dotted line OC21. Even a change in the value C of the capacitor Con, the overlapping area is almost the same and is relatively small. This means that even a change in the capacitor Con is less effective for improving the voltage variation at the power supply end portion of the interface circuits IF-U20 and IF-U11.

The power supply current spectrum IS30 in the interface circuit IF-U30 of USB 3.0 standard, on the other hand, overlaps with the impedance curves (e) to (h) in the region indicated by a dashed-dotted line OC3. By increasing the value C of the capacitor Con, the frequency at the antiresonance point is separated from the peak of the power supply current spectrum IS3 and further, the value of the impedance decreases. The overlapping area in the region of the dashed-dotted line OC3 can therefore be decreased by increasing the value C of the capacitor Con. This means that by increasing the capacitor Con, voltage variation at the power supply end portion of the interface circuit IF-U30 of USB 3.0 standard can be reduced.

By reducing voltage variation at the power supply end portion of the interface circuits IF-U30, IF-U20, and IF-U11, deterioration in the characteristic and malfunctions of these interface circuits can be prevented.

Based on the above finding, in First Embodiment, when viewed from the second main surface SAF2, the second external terminals SB2-A201 and SB2-A202 that supply an analog power supply voltage to the interface circuit IF-U20 of USB 2.0 standard are arranged closer to the semiconductor chip CH than the second external terminals SB2-A301 and SB2-A302 that supply an analog power supply voltage to the interface circuit IF-U30 of USB 3.0 standard, as shown in FIG. 8. By such arrangement, the power supply wiring La20 shown in FIG. 9 is shortened and the inductance Lp20 is decreased. As a result, the resonant circuit included of the parasitic inductance Lp20, the capacitor Con, and the parasitic resistance Rp20 is allowed to have, for example, an impedance characteristic as shown by the broken line (d) of FIG. 10. This makes it possible to reduce voltage variation at the power supply end portion in the interface circuit IF-U20 of USB 2.0 standard.

It is needless to say that the second external terminal SB2-A111 and SB2-A112 that supply an analog power supply voltage to the interface circuit IF-U11 of USB 1.1 standard may be arranged closer to the semiconductor chip CH than the second external terminals SB2-A301 and SB2-A302 that supply an analog power supply voltage to the interface circuit IF-U30 of USB 3.0 standard. This makes it possible to decrease the value of the parasitic inductance Lp11 shown in FIG. 9; enables the resonance circuit included of the parasitic inductance Lp11, the capacitor Con, and the parasitic resistance Rp11 to have an impedance characteristic, for example, as shown in the broken line (b), (c), or (d) of FIG. 10; and makes it possible to reduce voltage variation at the power supply end portion in the interface circuit IF-U11 of USB 1.1 standard.

Further, the second external terminals SB2-A201, SB2-A202, SB2-A111, and SB2-A112 may be arranged closer to the semiconductor chip CH than the second external terminals SB2-A301 and SB2-A302.

In First Embodiment, as shown in FIG. 5, the semiconductor chip CH is equipped with the capacitor CC and the switch SW. The capacitor CC and the switch SW are also shown in the equivalent circuit of FIG. 9. This switch SW is, for example, turned ON, for example, when the semiconductor chip CH is manufactured. In the interface circuit IF-U30 of USB 3.0 standard, therefore, the value of capacitance including the parasitic circuit is combined capacitance of the capacitor Con and the capacitor CC. As a result, the resonant circuit of the interface circuit IF-U30 of USB 3.0 standard has, for example, an impedance characteristic curve as shown by a broken line (h) in FIG. 11. This makes it possible to reduce voltage variation at the power supply end portion of USB 3.0 and to prevent deterioration in the characteristic of the interface circuit of USB 3.0 standard. It is needless to say that the switch SW may be turned OFF during manufacture when the value of the capacitor including the parasitic circuit is only the value of the capacitor Con and the resonant circuit is included of the parasitic inductance LP30, the capacitor Con, and the parasitic resistance Rp30 has a desired impedance characteristic. Further, it is unnecessary to provide the switch SW and the capacitor CC.

In particular, in the interface circuit of USB 2.0 standard, a major portion of the power supply current spectrum IS20 is present in the frequency band indicated by the dashed-dotted line OL21. It is therefore effective to shorten the power supply wiring La20 to decrease the parasitic inductance LP20, transfer the impedance characteristic of the resonant circuit to a higher frequency side, and thereby decrease the value of impedance.

<Constitution of Power Supply Wiring>

Figure 12:
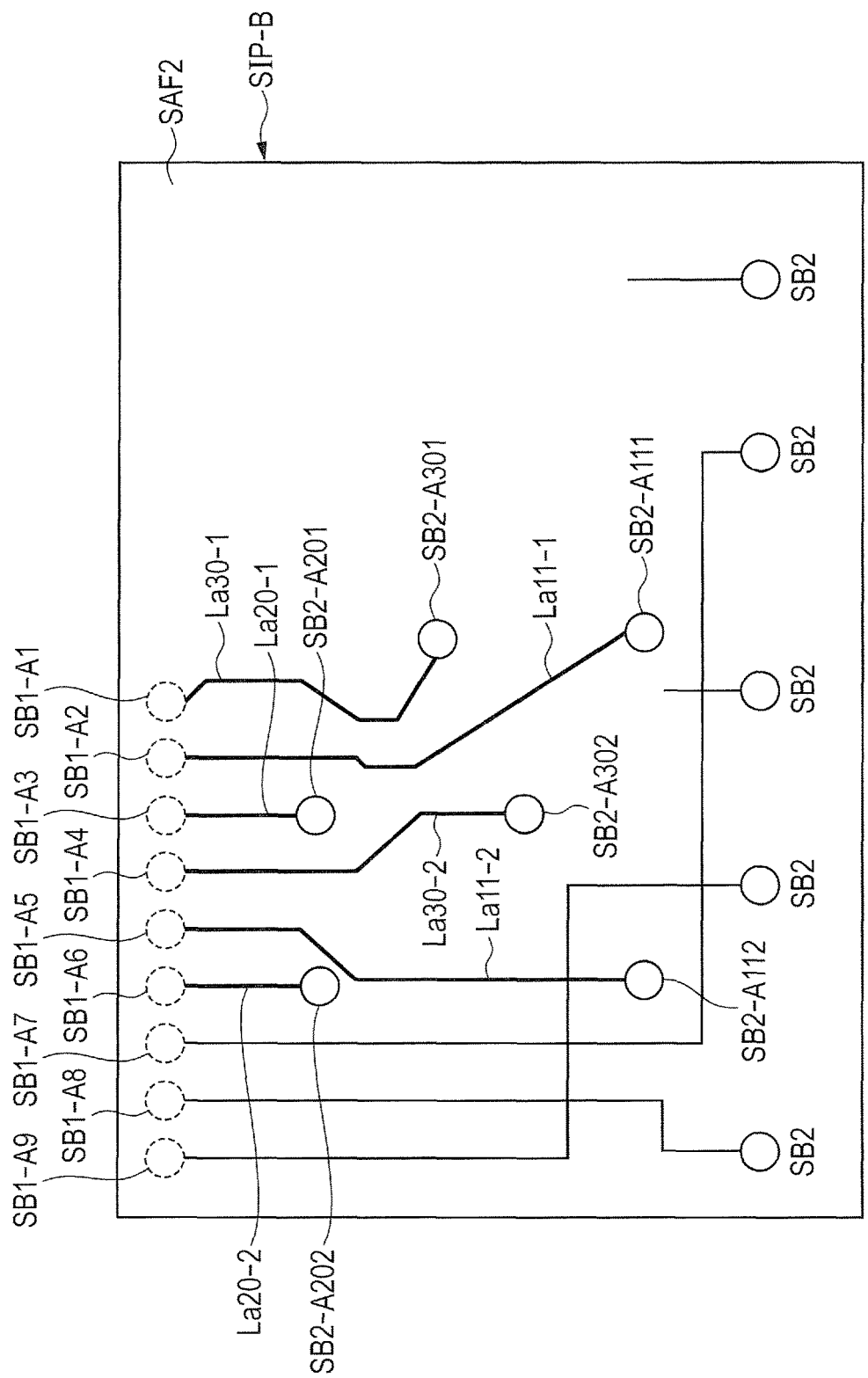
FIG. 12 is a plan view of the wiring board of First Embodiment.

FIG. 12 is a plan view of the wiring board SIP-B of First Embodiment. FIG. 12 is a plan view of the wiring board SIP-B viewed from the second main surface SAF2. In this drawing, a circle with a broken line shows the first external terminal formed on the first main surface SAF1 of the wiring board SIP-B and a circle with a solid line shows the second external terminal formed on the second main surface SAF2 of the wiring board SIP-B.

First external terminals SB1-A1 to SB1-A9 in FIG. 12 correspond to some of the first external terminals SB1-A1 to SB1-An shown in FIG. 7. Second external terminals SB2-A111, SB2-A112, SB2-A201, SB2-A202, SB2-A301, and SB2-A302 in FIG. 12 correspond to the second external terminals SB2-A111, SB2-A112, SB2-A201, SB2-A202, SB2-A301, and SB2-A302 shown in FIG. 8.

In this drawing, when the semiconductor chip CH is mounted on the wiring board SIP-B, the bump electrode BD-A30 (FIG. 5) that supplies an analog power supply voltage to the interface circuit IF-U30 of USB 3.0 standard formed on the semiconductor chip CH is coupled to the first external terminal SB1-A1 via a bump. In addition, the bump electrode BD-A20 (FIG. 5) that supplies an analog power supply voltage to the interface circuit IF-U20 of USB 2.0 standard formed on the semiconductor chip CH is coupled to the first external terminal SB1-A3 via a bump. Further, the bump electrode BD-A11 (FIG. 5) that supplies an analog power supply voltage to the interface circuit IF-U11 of USB 1.1 standard formed on the semiconductor chip CH is coupled to the first external terminal SB1-A2 via a bump.

Similarly, a bump electrode that supplies an analog power supply voltage to the interface circuit IF-U302 of USB 3.0 standard formed on the semiconductor chip CH is coupled to a first external terminal SB1-A4 via a bump. In addition, a bump electrode that supplies an analog power supply voltage to the interface circuit IF-U202 of USB 2.0 standard formed on the semiconductor chip CH is coupled to a first external terminal SB1-A6 via a bump. Further, a bump electrode that supplies an analog power supply voltage to the interface circuit IF-U112 of USB 1.1 standard formed on the semiconductor chip CH is coupled to a first external terminal SB1-A5 via a bump.

The first external terminal SB1-A1 is coupled to the second external terminal SB2-A301 via a power supply wiring La30-1; the first external terminal SB1-A3 is coupled to the second external terminal SB2-A201 via the power supply wiring La20-1; and the first external terminal SB1-A2 is coupled to the second external terminal SB2-A111 via a power supply wiring La11-1. These power supply wirings La30-1, La20-1, and La11-1 are metal wirings formed from a metal wiring layer in the wiring board SIP-B. In First Embodiment, the width of each of the power supply wirings La30-1, La20-1, and La11-1 is not particularly limited, but they have the same width. The shape of these power supply wirings is drawn so as to follow the shape of actual wirings in the wiring board SIP-B. Therefore, the power supply wiring La20-1 is shorter than the power supply wiring La30-1 and the power supply wiring La11-1 is longer than the power supply wiring La30-1.

In other words, when viewed from the second main surface SAF2, the second external terminal SB2-A201 is arranged closer to the semiconductor chip CH than the second external terminal SB2-A301. The second external terminal SB2-A111 is more distant from the semiconductor chip CH than the second external terminals SB2-A201 and SB2-A301.

The first external terminal SB1-A4 is coupled to the second external terminal SB2-A302 via the power supply wiring La30-2; the first external terminal SB1-A6 is coupled to the second external terminal SB2-A202 via the power supply wiring La20-2; and the first external terminal SB1-A5 is coupled to the second external terminal SB2-A112 via the power supply wiring La11-2. These power supply wirings La30-2, La20-2, and La11-2 are metal wirings formed from a metal wiring layer in the wiring board SIP-B. In First Embodiment, although the width of each of the power supply wirings La30-2, La20-2, and La11-2 is not particularly limited, they have the same width. The shape of these power supply wirings is drawn so as to follow the shape of the actual wiring in the wiring board SIP-B. Therefore, the power supply wiring La20-2 is shorter than the power supply wiring La30-2 and the power supply wiring La11-2 is longer than the power supply wiring La30-2.

In other words, when viewed from the second main surface SAF2, the second external terminal SB2-A202 is arranged closer to the semiconductor chip CH than the second external terminal SB2-A302. The second external terminal SB2-A112 is more distant from the semiconductor chip CH than the second external terminals SB2-A202 and SB2-A302.

Such a constitution makes the parasitic inductance that accompanies the power supply wiring of the USB-2.0 interface circuits IF-US20 and IF-U202 smaller than the parasitic inductance that accompanies the power supply wiring of the USB-3.0 interface circuits IF-US30 and IF-U302 and the USB-1.1 interface circuits IF-U11 and IF-U112. It is therefore possible to prevent deterioration in the characteristic or malfunctions of the USB-2.0 interface circuit.

(Second Embodiment)

Figure 13A:
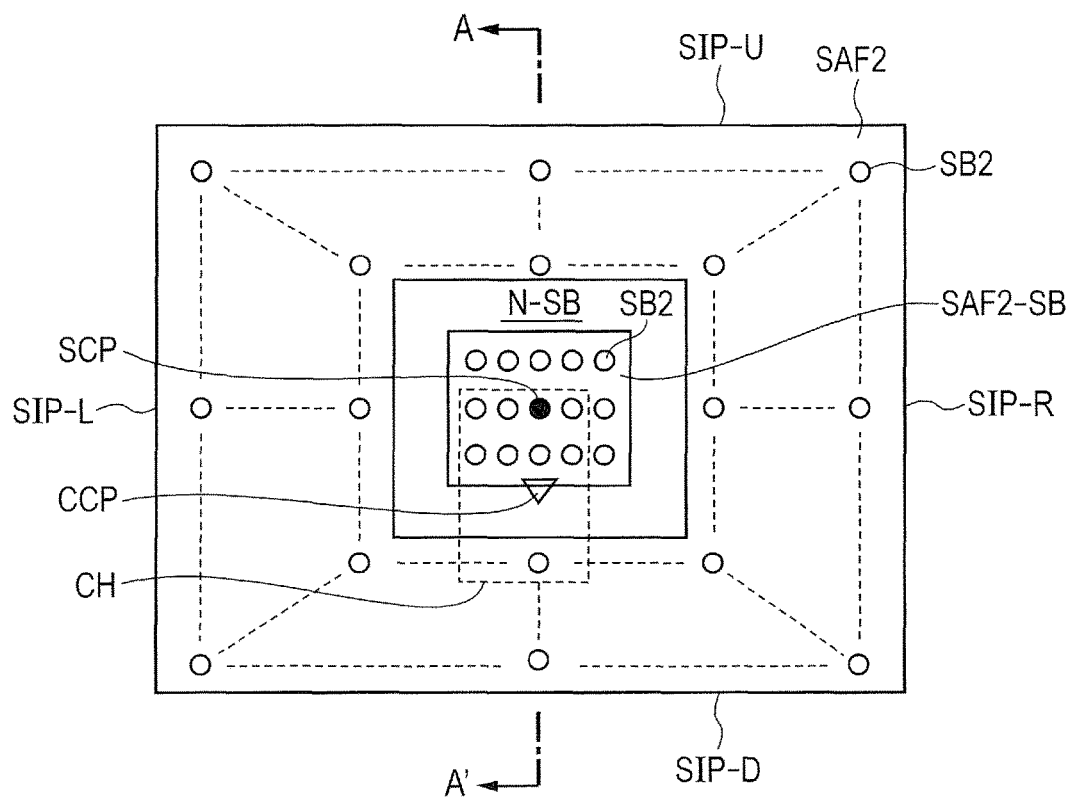
FIGS. 13A and 13B are a plan view and a cross-sectional view of a semiconductor device of Second Embodiment, respectively.
Figure 13B:
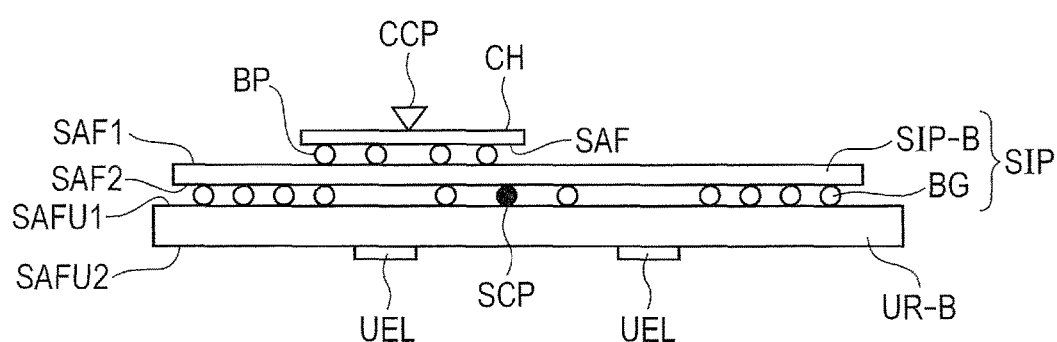

FIG. 13A is a plan view of a semiconductor device SIP of Second Embodiment. FIG. 13B is a cross-sectional view of the semiconductor device SIP taken along the line A-A' of FIG. 13A. FIG. 13B shows the semiconductor device SIP mounted on a user board UR-B, but the user board UR-B is omitted from FIG. 13A. In addition, FIG. 13A is a plan view of a wiring board SIP-B viewed from the side of a second main surface SAF2 thereof.

In FIG. 13A, although no particular limitation is imposed, the second main surface SAF2 of the wiring board SIP-B is included of three regions. Described specifically, the second main surface SAF2 is equipped with a region SAF2-SB (first region) at the center portion of the second main surface SAF2, a blank region N-SB (second region) that surrounds the region SAF2-SB, and a second external terminal group region (third region) between the blank region N-SB and SIP-U, SIP-D, SIP-R, and SIP-L, that is, the sides of the second main surface SAF2. This second external terminal group region is thought to be separated from the region SAF2-SB by the blank region N-SB.

The region SAF2-SB has therein a plurality of two-dimensionally (planarly) and regularly arranged second external terminals SB2. The second external terminal group region also has therein a plurality of two-dimensionally and regularly arranged second external terminals SB2. The blank region N-SB has, on the other hand, no second external terminal SB. The second external terminals SB arranged in the region SAF2-SB and the second external terminals SB2 arranged in the second external terminal group region have coupling to the first external terminals arranged on the first main surface SAF1 of the wiring board SIP-B via a wiring formed from a metal wiring layer in the wiring board SIP-B.

In Second Embodiment, although no particular limitation is imposed, the wiring board SI-B has, at the center of the second main surface SAF2 thereof, the second external terminals SB2. In FIG. 13A, the second external terminal arranged at the center is indicated as SCP. This means that the center of the second main surface SAF2 or the wiring board SIP-B is indicated as SCP.

In FIG. 13A, CH indicated by a broken line represents a semiconductor chip. In other words, the semiconductor chip CH viewed through the wiring board SIP-B from the side of the second main surface SAF2 is indicated by the broken line. The center of the main surface SAF of the semiconductor chip CH, in other words, the center of the semiconductor chip is indicated as CCP.

The semiconductor chip CH has, on the main surface SAF thereof, a plurality of bump electrodes as in First Embodiment. As shown in FIG. 13B, the semiconductor chip CH is mounted on the wiring board SIP-B so that its main surface SAF faces the first main surface SAF1 of the wiring board and bump electrodes formed on the main surface of the semiconductor chip CH are coupled to first external terminals arranged on the first main surface SAF1 of the wiring board SIP-B via bumps BP. In Second Embodiment, when the semiconductor chip CH is viewed from the side of the second main surface SAF2, the center CCP of the semiconductor chip CH does not coincide with the center SCP of the wiring board SIP-B and the semiconductor chip CH is mounted in such a manner that it crosses the blank region N-SB and overlaps with each of the region SAF2-SB, the blank region N-SB, and the second external terminal group region.

As shown in FIG. 13B, the wiring board SIP-B is mounted in such a manner that the second main surface SAF2 thereof faces a first main surface SAFU1 (third main surface) of a user board UR-B and second external terminals arranged on the main second main surface SAF2 are coupled to external terminals formed on the first main surface SAFU1 of the user board UR-B via a bump BG. The user board UR-B has, in a region of a second main surface SAFU2 (fourth main surface) thereof immediately below the blank region N-SB, a user's part UEL. When the wiring board and also the user board UR-B are viewed from the side of the second main surface SAFU2, the user's part UEL falls within the blank region N-SB.

Since the wiring board SIP-B has, in the second main surface SAF2 thereof, the blank region N-SB, external terminals to be coupled via the bump BG are not necessarily provided in a region of the first main surface of the user board UR-B facing the blank region N-SB. This enables users to mount a desired part in a region, in the second main surface SAFU2 of the user board UR-B, immediately below the blank region N-SB. As a result, user's freedom can be improved. For example, a resistive element is mounted as a user's part and reference signals formed by this resistive element are supplied to the second external terminals SB2 in the second external terminal region REF-SB1 described referring to FIG. 7.

Figure 14:
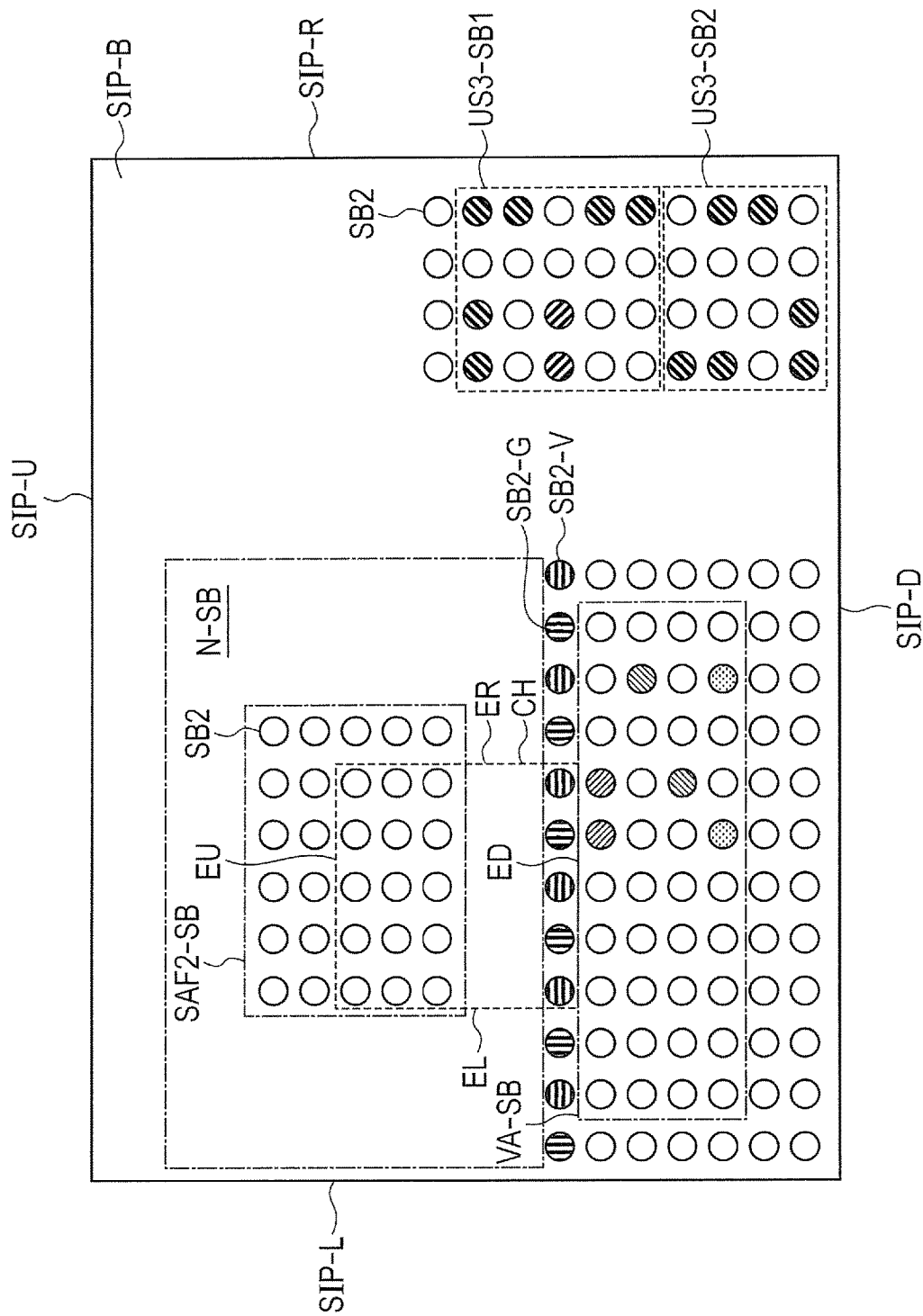
FIG. 14 is a plan view of a wiring board of Second Embodiment.

FIG. 14 is a plan view of the wiring board SIP-B of Second embodiment. It also shows the plane of the wiring board SIP-B when it is viewed from the side of the second main surface SAF2. In addition, the semiconductor chip CH mounted on the first main surface SAF1 is viewed through the wiring board SIP-B and indicated by a broken line. The plan view shown in FIG. 14 resembles the plan view shown in FIG. 8 so that only a difference will be described here.

In Second Embodiment, a single row of the second external terminals SB2 arranged adjacent to the blank region N-SB, among second external terminals arranged in the second external terminal region, are used as digital-power-supply second external terminals for supplying a digital power supply voltage. In FIG. 14, the digital-power-supply second external terminals are indicated by a circle with thick perpendicular lines and a circle with thick horizontal lines. Although no particular limitation is imposed, a second external terminal SB2-G indicated by a circle with thick perpendicular lines is used for supplying a digital ground voltage Vsd and a second external terminal SB2-V indicated by a circle with thick horizontal lines is used for supplying a digital power supply voltage Vdd.

A second external terminal region VA-SB having therein analog-power-supply second external terminals is on the side opposite to the blank region, with the row of the digital second external terminals SB2-G and SB2-V therebetween.

The semiconductor chip CH crosses the blank region N-SB and is on the first main surface SAF1 of the wiring board SIP-B so that the side ED is arranged between the row of the second external terminals SB2-G and SB2-V and the second external terminal region VA-SB. This means that when viewed from the second main surface SAF2, a portion of the semiconductor chip CH overlaps with the row of the second external terminals SB2-G and SB2-V and does not overlap with the second external terminal region VA-SB. Mounting in such a manner enables shortening of a power supply wiring for supplying a digital power supply voltage (power supply voltage Gdd and ground voltage Vsd) from the second external terminals SB2-G and SB2-V to the semiconductor chip CH and a power supply wiring for supplying an analog power supply voltage from analog-power-supply second external terminals arranged in the second external terminal region VA-SB to the semiconductor chip CH, thereby achieving reduction in malfunctions. The digital power supply voltage here is supplied, for example, as a power supply of a logic circuit including a microprocessor CPU and the analog power supply voltage is supplied to a high-speed interface circuit.

FIG. 14 shows a single row of the digital second external terminals SB2-G and SB2-V, but needless to say, it may be a plurality of rows or it may be not a row but a column.

In the above-described example, the center SCP of the wiring board SIP-B is not coincided with the center CCP of the semiconductor chip CH. Not only it, but, for example, the center SCP may be a center of the region SAF2-SB. In addition, in the above-described example, second external terminals are present at the center portion, but they may be not at the center portion.

According to First and Second Embodiments, the analog-power-supply-voltage second external terminals can be arranged in the vicinity of the semiconductor chip when viewed from the second main surface SAF2 and inductance of the power supply wiring can be reduced from 10 nH to, for example, 4 nH. This makes it possible to, for example, narrow the width of the wirings in the wiring layer of the wiring board SIP-B and thereby increase the density of the wirings in the wiring layer. As a result, a downsized semiconductor device SIP can be provided at a reduced cost.

The invention made by the present inventors has been described specifically based on some embodiments. It is needless to say that the invention is not limited to or by the above-described embodiments but can be changed variously without departing from the gist of the invention.

What is claimed is:

1. A semiconductor device, comprising:
a semiconductor chip having a first circuit that operates at a first power supply voltage and outputs a first signal and a second circuit that operates at a second power supply voltage different from the first power supply voltage and outputs a second signal, and including a main surface over which a plurality of bump electrodes are formed, including bump electrodes to be supplied with the first power supply voltage, the second power supply voltage, the first signal, and the second signal, respectively; and
a wiring board including:
a first main surface facing the main surface of the semiconductor chip and having an area greater than an area of the main surface,
a wiring layer,
a second main surface opposite to the first main surface via the wiring layer and having an area greater than an area of the main surface of the semiconductor chip,
a plurality of first external terminals formed on the first main surface, and
a plurality of second external terminals coupled to the first external terminals via wirings in the wiring layer and formed on the second main surface, over which the semiconductor chip is mounted such that the main surface of the semiconductor chip faces the first main surface, and such that the bump electrodes are coupled with the first external terminals,
wherein, when viewed from the second main surface, second external terminals to be supplied with the first power supply voltage and the second power supply voltage are arranged closer to the semiconductor chip than second external terminals to be supplied with the first signal and the second signal.

2. The semiconductor device according to claim 1,
wherein when viewed from the second main surface, the second external terminals to be supplied with the second power supply voltage are closer to the second external terminals to be supplied with the first power supply voltage than any of the second external terminals to be supplied with the first signal and the second signal.

3. The semiconductor device according to claim 2,
wherein the first signal is a signal that changes at a first data transfer rate and the second signal is a signal that changes at a second data transfer rate higher than the first data transfer rate, and
wherein when viewed from the second main surface, the second external terminals to be supplied with the first power supply voltage are closer to the semiconductor chip than the second external terminals to be supplied with the second power supply voltage.

4. The semiconductor device according to claim 3,
wherein the semiconductor chip has a third circuit that operates at a third power supply voltage different from the first power supply voltage and the second power supply voltage and outputs a third signal, and
wherein when viewed from the second main surface, second external terminals to be supplied with the third power supply voltage are more distant along a first direction from the semiconductor chip than the second external terminals to be supplied with the first signal and the second signal.

5. The semiconductor device according to claim 4,
wherein the third signal changes at a data transfer rate slower than the first data transfer rate, and
wherein when viewed from the second main surface, the second external terminals to be supplied with the third power supply voltage are more distant from the semiconductor chip than the second external terminal to be supplied with the second power supply voltage.

6. The semiconductor device according to claim 5,
wherein the first signal is a signal according to USB 2.0 standard, the second signal is a signal according to USB 3.0 standard, and the third signal is a signal according to USB 1.1 standard.

7. The semiconductor device according to claim 6,
wherein the semiconductor chip has a main surface with four sides, and the first circuit, the second circuit, and the third circuit are along the sides of the semiconductor chip.

8. The semiconductor device according to claim 7,
wherein the first signal, the second signal, and the third signal are each a differential signal.

9. The semiconductor device according to claim 1,
wherein the semiconductor chip is over the wiring board so that a center portion of the main surface of the semiconductor chip does not coincide with a center portion of the first main surface of the wiring board.

10. The semiconductor device according to claim 9,
wherein the semiconductor chip is equipped with a logic circuit that operates at a power supply voltage from a predetermined one of the bump electrodes;
wherein the second main surface is equipped with a first region, a second region surrounding the first region, and a third region separated from the first region by the second region;
wherein when viewed from the second main surface, a first set of the second external terminals is two-dimensionally arranged in the first region and a second set of the second external terminals is two-dimensionally arranged in the third region;
wherein when viewed from the second main surface, the semiconductor chip is over the wiring board so as to cross the second region and overlap with a portion of each of the first region and the third region, and
wherein when viewed from the second main surface, in the third region, a plurality of second external terminals arranged in a region overlapping with the semiconductor chip are supplied with the power supply voltage to be supplied to the logic circuit.

11. The semiconductor device according to claim 10,
wherein the second external terminals to be supplied with the first power supply voltage and the second external terminals to be supplied with the second power supply voltage are different from the second external terminals arranged in the third region and to be supplied with the power supply voltage for the logic circuit.

12. The semiconductor device according to claim 11,
wherein the second region has no second external terminal therein.

13. The semiconductor device according to claim 12,
wherein a user board has a third main surface facing the second main surface and the user board is mounted so that a plurality of external terminals formed on the third main surface are coupled to the second external terminals; and
wherein when viewed from a fourth main surface on a side opposite to the third main surface, electronic parts are mounted in a region of the fourth main surface overlapping the second region.

14. The semiconductor device according to claim 11,
wherein a power supply voltage to be supplied to the logic circuit is a digital power supply voltage; and
wherein the first circuit and the second circuit are each equipped with a differential circuit, and the first power supply voltage and the second power voltage are analog power supply voltages that operate the respective differential circuit.

15. The semiconductor device according to claim 1,
wherein the semiconductor chip is equipped with a logic circuit that operates at a power supply voltage from a predetermined one of the bump electrodes;
wherein the second main surface is equipped with a first region, a second region surrounding the first region, and a third region separated from the first region by the second region;
wherein when viewed from the second main surface, a first set of the second external terminals is two-dimensionally arranged in the first region and a second set of the second external terminals is two-dimensionally arranged in the third region;
wherein when viewed from the second main surface, a center portion of the second main surface overlaps with a center portion of the first region,
wherein when viewed from the second main surface, the semiconductor chip crosses the second region and overlaps with a portion of each of the first region and the third region, and
wherein viewed from the second main surface, the power supply voltage to be supplied to the logic circuit is supplied via a plurality of second external terminals arranged in a portion of the third region overlapping with the semiconductor chip.

16. The semiconductor device according to claim 15,
wherein the second external terminals to be supplied with the first power supply voltage and the second power supply voltage are different from the second external terminals arranged in the third region and to be supplied with the power supply voltage for the logic circuit.

* * * * *